US012765348B2

(12) United States Patent
Yanagawa et al.

(10) Patent No.: US 12,765,348 B2
(45) Date of Patent: Oct. 13, 2026

(54) SEMICONDUCTOR DEVICE WITH PARTITION PORTIONS AND GAPS ALTERNATELY FORMED BETWEEN WIRINGS IN A WIRING EXTENDING DIRECTION

(71) Applicant: SONY SEMICONDUCTOR SOLUTIONS CORPORATION, Kanagawa (JP)

(72) Inventors: Yoshiaki Yanagawa, Tokyo (JP); Takushi Shigetoshi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 451 days.

(21) Appl. No.: 18/550,284

(22) PCT Filed: Feb. 18, 2022

(86) PCT No.: PCT/JP2022/006670
§ 371 (c)(1),
(2) Date: Sep. 12, 2023

(87) PCT Pub. No.: WO2022/202015
PCT Pub. Date: Sep. 29, 2022

(65) Prior Publication Data

US 2024/0162173 A1 May 16, 2024

(30) Foreign Application Priority Data

Mar. 24, 2021 (JP) ................................ 2021-049699

(51) Int. Cl.
*H10W 20/20* (2026.01)
*H10W 20/43* (2026.01)
(Continued)

(52) U.S. Cl.
CPC ........... *H10W 20/20* (2026.01); *H10W 20/43* (2026.01); *H10W 70/60* (2026.01); *H10W 70/65* (2026.01); *H10W 70/68* (2026.01)

(58) Field of Classification Search
CPC ..... H10W 20/20; H10W 20/43; H10W 70/60; H10W 70/65; H10W 70/68; H01L 23/481;
(Continued)

(56) References Cited

U.S. PATENT DOCUMENTS

2014/0367862 A1* 12/2014 Kraft .................... H01L 21/743 257/774
2016/0218073 A1 7/2016 Yoshioka
(Continued)

FOREIGN PATENT DOCUMENTS

JP H07-335747 12/1995
JP 2010-258073 11/2010
(Continued)

OTHER PUBLICATIONS

International Search Report and Written Opinion prepared by the Japan Patent Office on Apr. 13, 2022, for International Application No. PCT/JP2022/006670, 2 pgs.

*Primary Examiner* — Herve-Louis Y Assouman
(74) *Attorney, Agent, or Firm* — SHERIDAN ROSS P.C.

(57) ABSTRACT

A semiconductor device includes a semiconductor substrate, a wiring layer including an electrode pad, the wiring layer formed on a first surface of the semiconductor substrate, a redistribution layer including wiring electrically connected to the electrode pad via a via, the redistribution layer formed on a second surface side opposite to the first surface of the semiconductor substrate, a protective film formed on a surface on a side opposite to the semiconductor substrate in the redistribution layer, and a partition formed by an insulating material, the partition arranged between pieces of
(Continued)

wiring in the redistribution layer, in which the partition and a void are alternately formed between the pieces of wiring in a direction in which the wiring extends.

20 Claims, 18 Drawing Sheets

(51) Int. Cl.

| | |
|---|---|
| ***H10W 70/60*** | (2026.01) |
| ***H10W 70/65*** | (2026.01) |
| ***H10W 70/68*** | (2026.01) |
| ***H10W 72/20*** | (2026.01) |
| ***H10W 72/90*** | (2026.01) |
| ***H10W 90/00*** | (2026.01) |

(58) Field of Classification Search
CPC . H01L 2224/02372; H01L 2224/16146; H01L 24/13; H01L 23/12; H01L 24/05; H01L 24/08
See application file for complete search history.

(56) References Cited

U.S. PATENT DOCUMENTS

| | | | | |
|---|---|---|---|---|
| 2017/0358506 | A1 | 12/2017 | Ohashi et al. | |
| 2019/0148439 | A1 * | 5/2019 | Shin | H10F 19/50 257/443 |
| 2020/0013821 | A1 * | 1/2020 | Oota | G02B 5/201 |

FOREIGN PATENT DOCUMENTS

| | | | | |
|---|---|---|---|---|
| JP | 2010258073 | A * | 11/2010 | H01L 21/768 |
| JP | 2011-029226 | | 2/2011 | |
| JP | 2017-220642 | | 12/2017 | |
| JP | 2020-198374 | | 12/2020 | |
| WO | WO 2015/079648 | | 6/2015 | |

* cited by examiner

SEMICONDUCTOR DEVICE WITH PARTITION PORTIONS AND GAPS ALTERNATELY FORMED BETWEEN WIRINGS IN A WIRING EXTENDING DIRECTION

CROSS REFERENCE TO RELATED APPLICATIONS

This application is a national stage application under 35 U.S.C. 371 and claims the benefit of PCT Application No. PCT/JP2022/006670, having an international filing date of 18 Feb. 2022, which designated the United States, which PCT application claimed the benefit of Japanese Patent Application No. 2021-049699, filed 24 Mar. 2021, the entire disclosures of each of which are incorporated herein by reference.

TECHNICAL FIELD

The present technology relates to a semiconductor device provided with a redistribution layer and a semiconductor device manufacturing method.

BACKGROUND ART

There is a semiconductor device in which a redistribution layer (RDL) is formed in order to electrically connect an electrode pad formed in a wiring layer to an external device.

Wiring formed in the redistribution layer for a high-speed operation of the semiconductor device has become finer.

When a distance between pieces of wiring becomes shorter, an inter-wiring capacitance increases to hinder the high-speed operation.

In view of such a problem, Patent Document 1 described below discloses a technology of reducing an electrostatic capacitance by providing a void between the pieces of wiring.

CITATION LIST

Patent Document

Patent Document 1: Japanese Patent Application Laid-Open No. H07-335747

SUMMARY OF THE INVENTION

Problems to be Solved by the Invention

In a spin coating method, a chemical liquid is dropped to the center of a semiconductor wafer, and the chemical liquid is substantially uniformly applied to an entire semiconductor wafer surface by a centrifugal force of the semiconductor wafer. Therefore, the chemical liquid spreads radially from the center of the semiconductor wafer.

In this case, a void is easily formed in a case where a direction in which the wiring extends and a direction in which the chemical liquid flows are orthogonal to each other, but it is difficult to say that the void is surely formed in a case where the direction in which the wiring extends and the direction in which the chemical liquid flows are substantially parallel to each other.

The present technology has been made in view of such a problem, and an object thereof is to surely form a void between the pieces of wiring.

Solutions to Problems

A semiconductor device according to the present technology includes a semiconductor substrate, a wiring layer including an electrode pad, the wiring layer formed on a first surface of the semiconductor substrate, a redistribution layer including wiring electrically connected to the electrode pad via a via, the redistribution layer formed on a second surface side opposite to the first surface of the semiconductor substrate, a protective film formed on a surface on a side opposite to the semiconductor substrate in the redistribution layer, and a partition formed by an insulating material, the partition arranged between pieces of wiring in the redistribution layer, in which the partition and a void are alternately formed between the pieces of wiring in a direction in which the wiring extends.

Therefore, the two pieces of wiring and two partitions form the void.

A semiconductor device manufacturing method according to the present technology includes alternately forming, in a semiconductor substrate on a first surface of which a wiring layer including an electrode pad is formed and on a second surface side of which a redistribution layer including wiring electrically connected to the electrode pad via a via is formed, the second surface side opposite to the first surface, a partition and a void in a direction in which the wiring extends between pieces of wiring in the redistribution layer.

MODE FOR CARRYING OUT THE INVENTION

Hereinafter, embodiments according to the present technology are described in the following order with reference to the accompanying drawings.

<1. Configuration of Semiconductor Device>
<2. Inter-Wiring Capacitance>
<3. Manufacturing Method>
<4. Variations>
<4-1. First Variation>
<4-2. Second Variation>
<4-3. Third Variation>
<4-4. Fourth Variation>
<4-5. Other Variations>
<5. Summary>
<6. Present Technology>

1. CONFIGURATION OF SEMICONDUCTOR DEVICE

Figure 1:
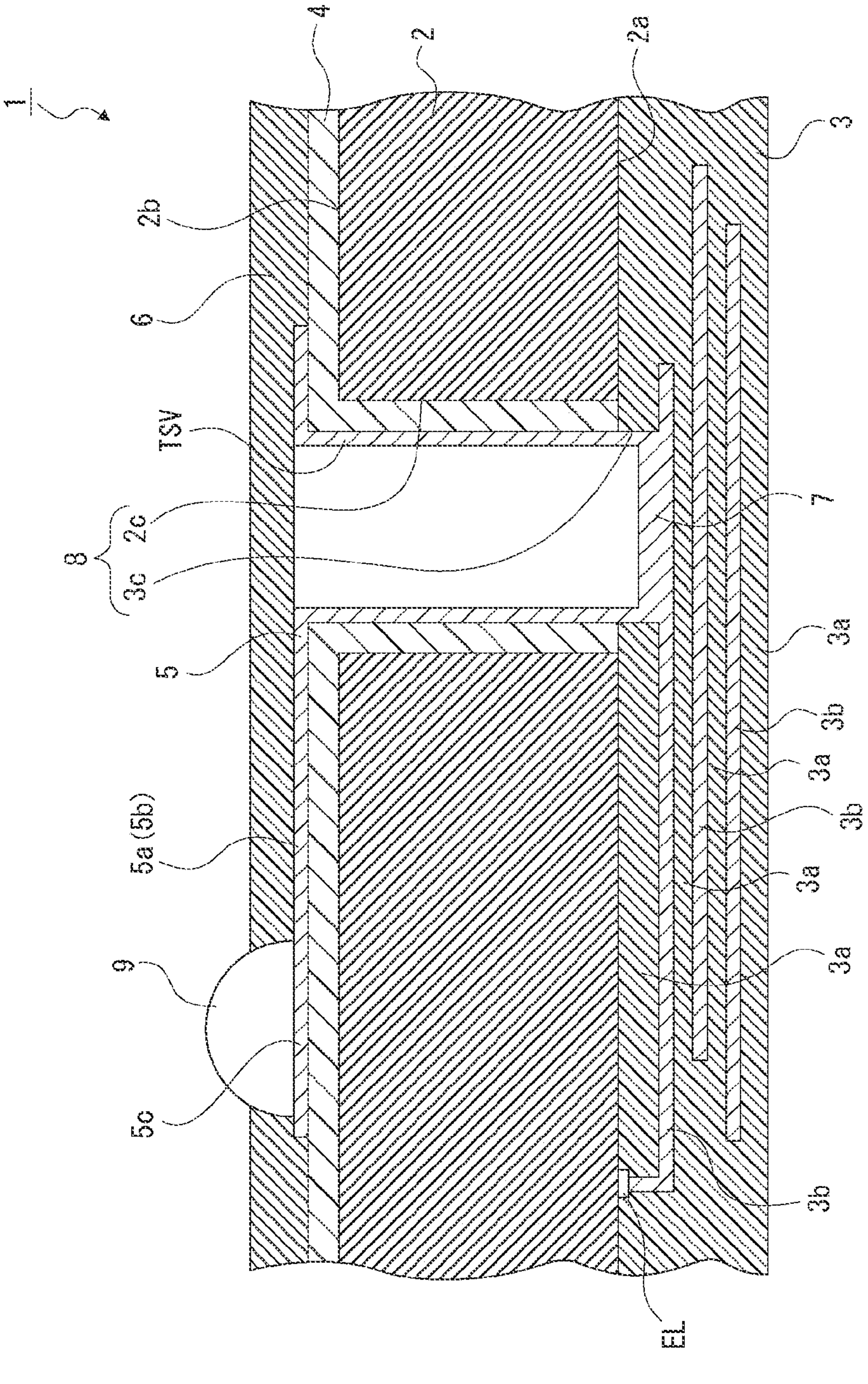
FIG. 1 is a cross-sectional view illustrating an example of a semiconductor device.

A semiconductor device 1 according to the present technology is manufactured by, for example, a wafer level chip size package (WCSP) technology. FIG. 1 illustrates a cross section of an example of a configuration of the semiconductor device 1.

The semiconductor device 1 is provided with a semiconductor substrate 2, a wiring layer 3 stacked on a front surface 2*a* of the semiconductor substrate 2, an insulating resin film 4 stacked on a back surface 2*b* of the semiconductor substrate 2, a redistribution layer (RDL) 5, and a protective film 6.

Note that, in each cross-sectional view below, a lower side of the drawing when a reference sign is seen in a correct direction is set as a front surface side, and an upper side of the drawing is set as a back surface side.

The semiconductor substrate 2 is, for example, a silicon layer, and is formed to have a certain thickness, thereby improving strength of a semiconductor wafer.

Various semiconductor elements EL such as transistors are formed on the front surface 2*a* of the semiconductor substrate 2. Furthermore, a through hole 2*c* is formed at a predetermined position of the semiconductor substrate 2.

The wiring layer 3 includes a plurality of layers covering the front surface 2*a* of the semiconductor substrate 2 on which the transistors are formed. The wiring layer 3 is formed by alternately stacking a first layer 3*a* including an insulating material and a second layer 3*b* on which a wiring pattern is formed. The simplest structure of the wiring layer 3 is a three-layer structure including two first layers 3*a* and a second layer 3*b* formed therebetween.

The wiring layer 3 in the example illustrated in FIG. 1 has a seven-layer structure including four first layers 3*a* and three second layers 3*b*.

In the wiring layer 3, vias (not illustrated) that electrically connect the second layers 3*b* are formed in a stacking direction.

On the second layer 3*b* included in the wiring layer 3, an electrode pad 7 for being electrically connected to an external device is formed. In the example illustrated in FIG. 1, the electrode pad 7 is formed on the second layer 3*b* the closest to the semiconductor substrate 2 among the three second layers 3*b*.

In the wiring layer 3, a recess 3*c* continuous to the through hole 2*c* of the semiconductor substrate 2 is formed. The recess 3*c* is formed in such a manner that at least a part of the electrode pad 7 is exposed.

The through hole 2*c* and the recess 3*c* are made a hole 8 formed in the semiconductor substrate 2 and the wiring layer 3 in the stacking direction.

The electrode pad 7 and the hole 8 are provided at the same position as seen in the stacking direction of the respective layers. That is, the electrode pad 7 is partially exposed on a bottom surface of the hole 8.

The insulating resin film 4 is a layer provided so as to avoid unnecessary electrical connection between the semiconductor substrate 2 and the redistribution layer 5, and is an organic film of polyimide, silicon, acrylic, epoxy, spin-on carbon (SOC) and the like.

The insulating resin film 4 is formed not only on the back surface 2*b* of the semiconductor substrate 2 but also across an inner peripheral surface of the hole 8.

The redistribution layer 5 is a layer formed at a predetermined position of an inner peripheral surface of the insulating resin film 4 formed across the inner peripheral surface of the hole 8 and a front surface of the insulating resin film 4 formed on the front surface 2*a* of the semiconductor substrate 2, thereby being electrically connected to the electrode pad 7.

In the redistribution layer 5, a portion formed on the inner peripheral surface of the insulating resin film 4 formed across the inner peripheral surface of the hole 8 is made a through electrode TSV.

The redistribution layer 5 formed at the predetermined position of the front surface of the insulating resin film 4 includes single wiring 5a, parallel wiring 5b, a connection pad 5c and the like. In the example illustrated in FIG. 1, for example, the connection pad 5c on which a metal bump 9 of solder and the like is formed is formed at a predetermined position.

The parallel wiring 5b includes two or more pieces of wiring extending in substantially the same direction at an inter-wiring distance shorter than a certain distance, and may include, for example, two pieces of wiring extending in parallel, or one wiring extending linearly and the other wiring that meanders.

In order for the semiconductor device 1 to operate at a high speed, an inter-wiring capacitance of the parallel wiring 5b is problematic.

The single wiring does not include other wiring arranged in parallel.

The redistribution layer 5 includes titanium (Ti), copper (Cu), tantalum (Ta), nickel (Ni), tungsten (W) and the like.

Note that, as is described in detail later, a partition 10 and a void 11 are alternately formed between the pieces of wiring of the parallel wiring 5b.

The protective film 6 is a layer formed on a back surface side of the redistribution layer 5. The protective film 6 includes an insulating resin material and the like, and is formed by a spin coating method.

Figure 2:
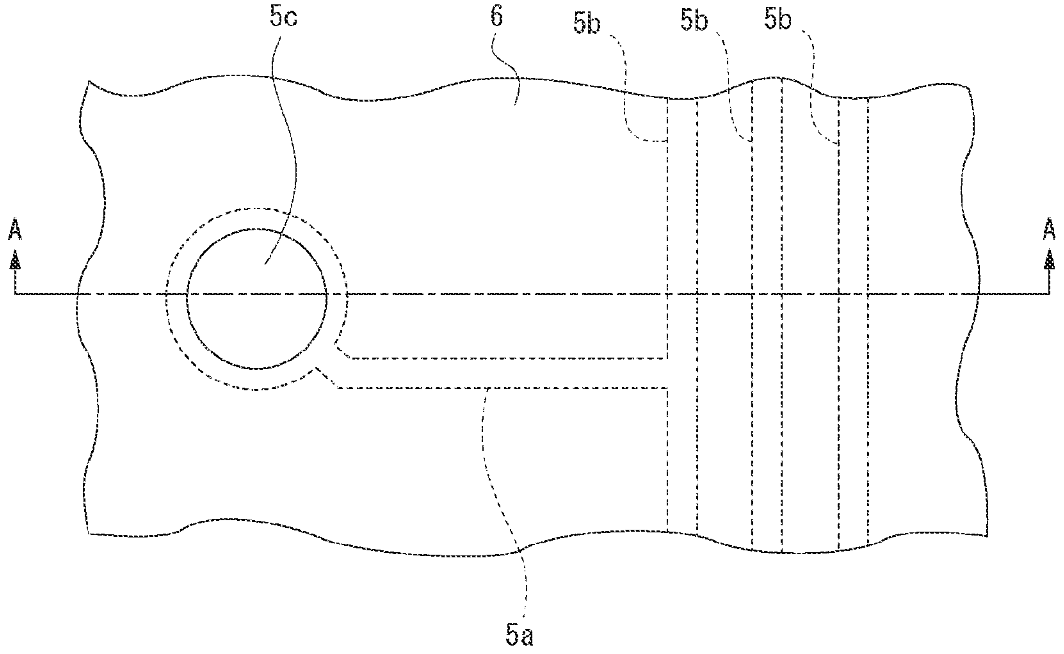
FIG. 2 is a diagram illustrating an example of a redistribution layer together with FIG. 3, and is a plane view of a back surface side.
Figure 3:
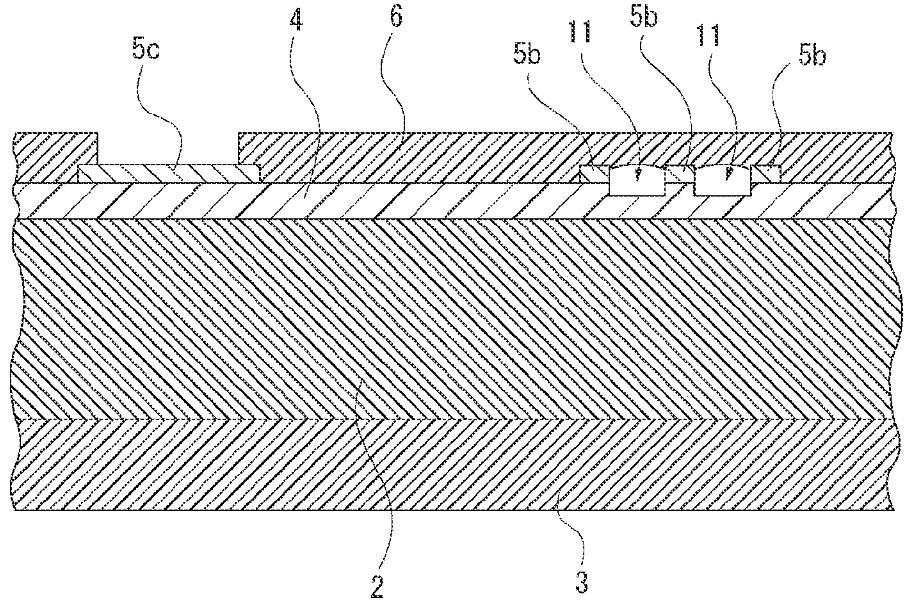
FIG. 3 is a cross-sectional view of the example of the redistribution layer.

FIGS. 2 and 3 illustrate an example of the redistribution layer 5. FIG. 2 illustrates the redistribution layer 5 indicated by broken line as seen from the back surface side. FIG. 3 is a longitudinal sectional view taken along line A-A in FIG. 2.

As illustrated in FIG. 2, a part of the connection pad 5c is exposed to the back surface side, but the single wiring 5a and the parallel wiring 5b are covered with the protective film 6 and cannot be visually recognized.

As illustrated in FIG. 3, the void 11 is formed between the pieces of wiring of the parallel wiring 5b. The void 11 is formed by preventing the protective film 6 from entering between the pieces of wiring of the parallel wiring 5b.

Furthermore, the void 11 is formed by scraping not only between the pieces of wiring of the parallel wiring 5b but also to the back surface side of the insulating resin film 4.

By forming the void 11 between the pieces of wiring of the parallel wiring 5b in this manner, the inter-wiring capacitance is reduced.

Figure 4:
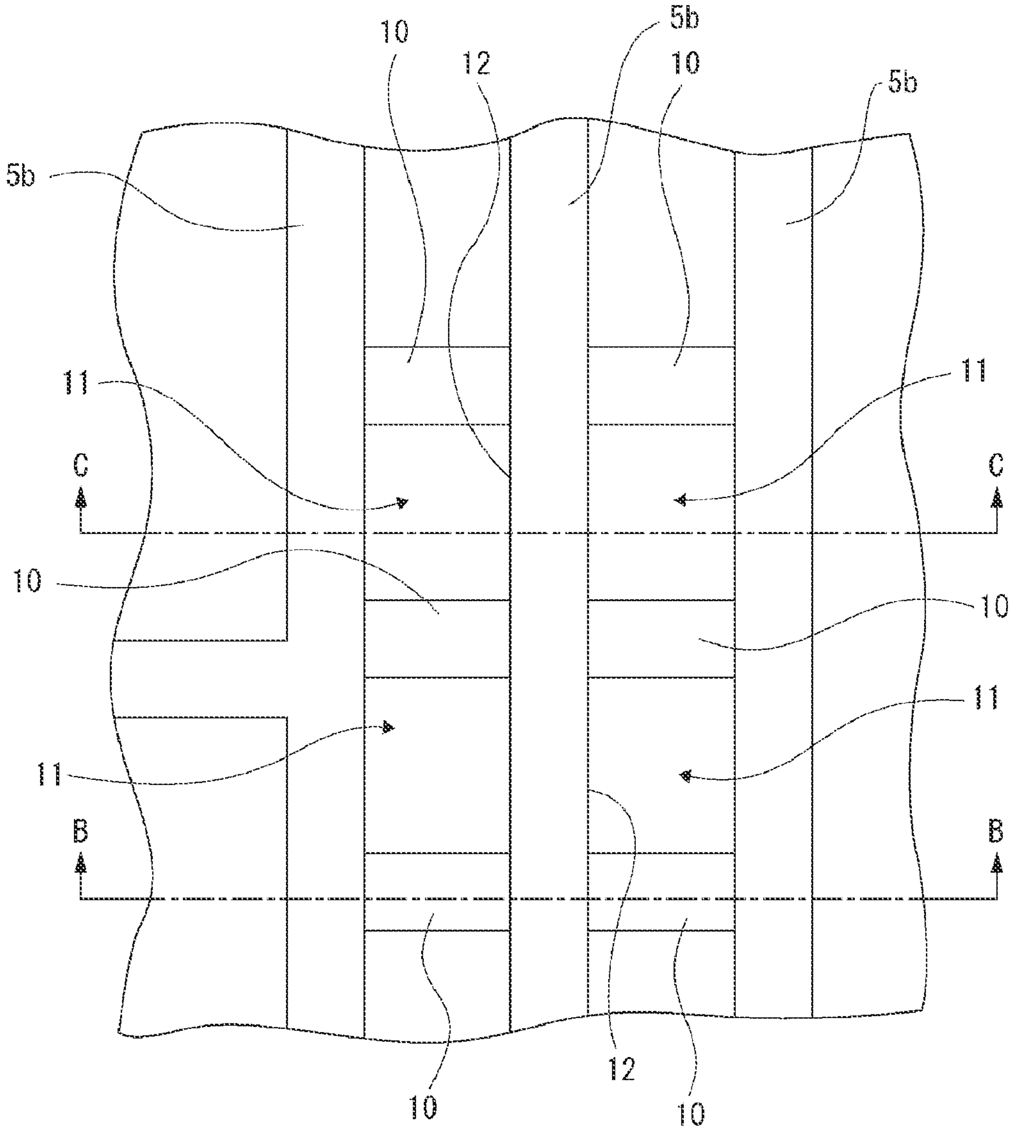
FIG. 4 is a plane view of a back surface side illustrating a state in which a partition and a void are formed between pieces of wiring of parallel wiring.

The partition 10 forming the void 11 is illustrated in FIG. 4. Note that, FIG. 4 is a view in which the protective film 6 formed on the back surface side of the redistribution layer 5 is not illustrated.

The partition 10 and the void 11 are alternately formed between the pieces of wiring of the parallel wiring 5b in a direction in which the parallel wiring 5b extend.

A material of the partition 10 may be organic or inorganic. Specifically, the partition 10 includes $SiO_2$, SiON, an organic resin material and the like.

Figure 5:
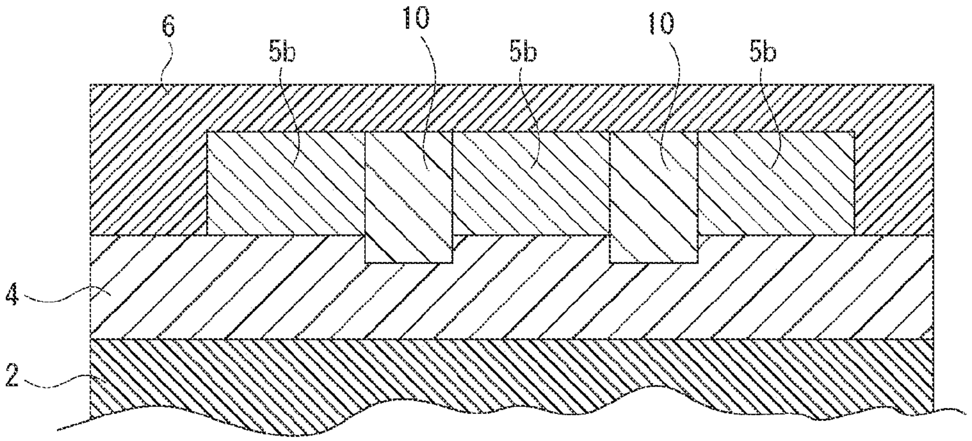
FIG. 5 is a cross-sectional view taken along line B-B in FIG. 4.

FIG. 5 is a cross-sectional view taken along line B-B in FIG. 4, the cross-sectional view of a portion in which the partition 10 is formed. As illustrated in FIG. 5, the partition 10 has a substantially rectangular parallelepiped shape, and is arranged on a bottom surface of a groove 12 between the pieces of wiring of the parallel wiring 5b.

Figure 6:
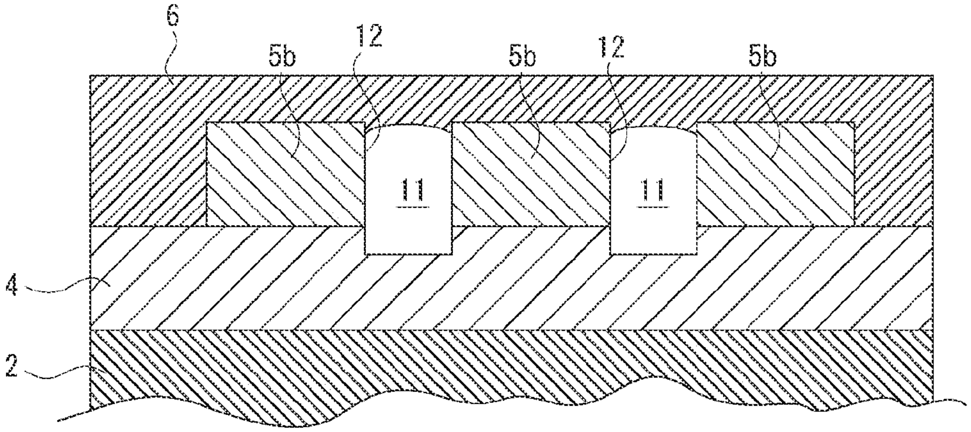
FIG. 6 is a cross-sectional view taken along line C-C in FIG. 4.

The partitions 10 are formed at regular intervals in the groove 12 between the pieces of wiring of the parallel wiring 5b, so that the void 11 is formed. FIG. 6 is a cross-sectional view taken along line C-C in FIG. 4, the cross-sectional view of a portion in which the void 11 is formed.

As illustrated, the void 11 is formed by preventing the protective film 6 from entering the groove 12.

2. INTER-WIRING CAPACITANCE

The inter-wiring capacitance of the parallel wiring 5b is described.

An inter-wiring capacitance Q may be expressed by following expression (1) using an electrostatic capacitance C and a voltage V.

$$Q=C\cdot V \qquad \text{Expression (1)}$$

Here, the electrostatic capacitance C may be expressed by following expression (2) using a dielectric constant £, a side surface area S, and an inter-wiring distance d.

$$C=\varepsilon\cdot S/d \qquad \text{Expression (2)}$$

The side surface area S is an area of a side surface 13 of the parallel wiring 5b. The inter-wiring distance d is a distance between surfaces opposed to each other of the parallel wiring 5b (refer to FIG. 7).

The dielectric constant c varies depending on a material. Specifically, this may be expressed by following expression (3).

$$\varepsilon=\varepsilon_0\cdot\varepsilon_r \qquad \text{Expression (3)}$$

Here, $\varepsilon_0$ represents a dielectric constant of vacuum, and $\varepsilon_r$ represents a relative dielectric constant, which is a ratio of the dielectric constant to vacuum.

Here, for example, in a case where the partition 10 and the void 11 are not formed in the groove 12, the protective film 6 enters the groove 12, so that the side surface 13 entirely comes into contact with the protective film 6.

The relative dielectric constant $\varepsilon_r$ of the material forming the protective film 6 is higher than the relative dielectric constant of vacuum or air.

Therefore, the dielectric constant c has a value higher than that of vacuum or air, so that the electrostatic capacitance C increases, and the inter-wiring capacitance Q also increases.

Figure 7:
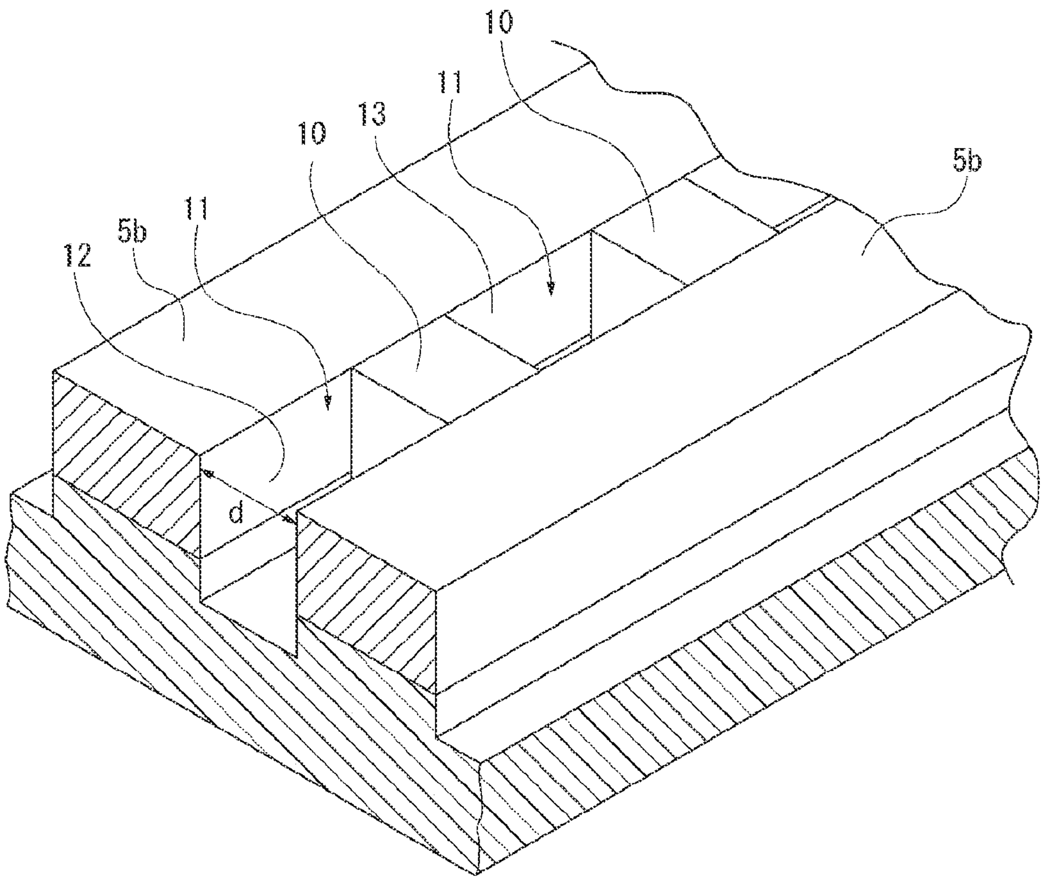
FIG. 7 is an enlarged cross-sectional view illustrating the parallel wiring, partition, and void.

In contrast, as illustrated in FIG. 7, by forming the partition 10 in the groove 12, the void 11 which the protective film 6 does not enter is formed. Therefore, the side surface 13 partially comes into contact with air.

In this case, the relative dielectric constant $\varepsilon_r$ of air is set lower than the relative dielectric constant $\varepsilon_r$ of the protective film 6, so that the electrostatic capacitance of the side surface 13 is made small, and the inter-wiring capacitance Q may be reduced.

This effect increases as a contact area between the side surface 13 and the void 11 increases, that is, as a contact area between the side surface 13 and the partition 10 decreases.

3. MANUFACTURING METHOD

A manufacturing method of the semiconductor device 1 is specifically described with reference to the attached drawing.

Figure 8:
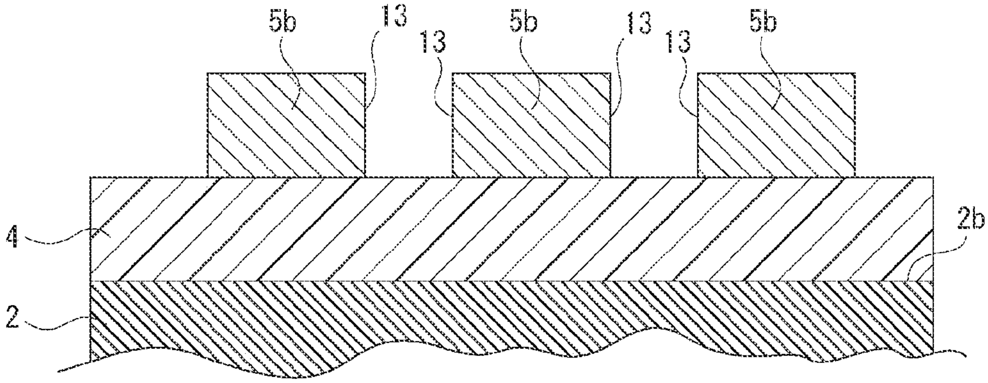
FIG. 8 is a cross-sectional view illustrating a state in which the redistribution layer is formed.

FIG. 8 illustrates a state in which the insulating resin film 4 is formed on the back surface 2b of the semiconductor substrate 2, and the parallel wiring 5b of the redistribution layer 5 is further formed on the back surface side thereof. That is, when the state illustrated in FIG. 8 is seen from the back surface side, a wiring pattern as the redistribution layer 5 is formed on the front surface of the insulating resin film 4.

Furthermore, in this example, three pieces of parallel wiring 5b are taken as an example.

Note that, in FIG. 8 and subsequent drawings, illustration of the wiring layer 3 formed on the front surface 2*a* of the semiconductor substrate 2 is omitted.

Figure 9:
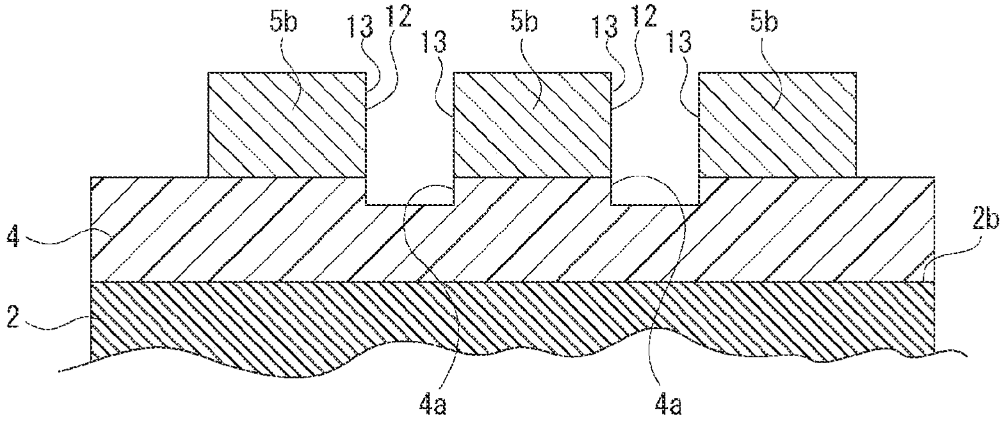
FIG. 9 is a cross-sectional view illustrating a state in which a recess groove is formed.

Subsequently, as illustrated in FIG. 9, a recessed groove 4*a* opened to the back surface side and a lateral side is formed in the insulating resin film 4. The recessed groove 4*a* is formed so as to be continuous to the side surface 13 of the parallel wiring 5*b*. Furthermore, the side surface 13 of the parallel wiring 5*b* and the recessed groove 4*a* of the insulating resin film 4 are formed as a groove 12.

This treatment is implemented by, for example, an etching treatment.

Figure 10:
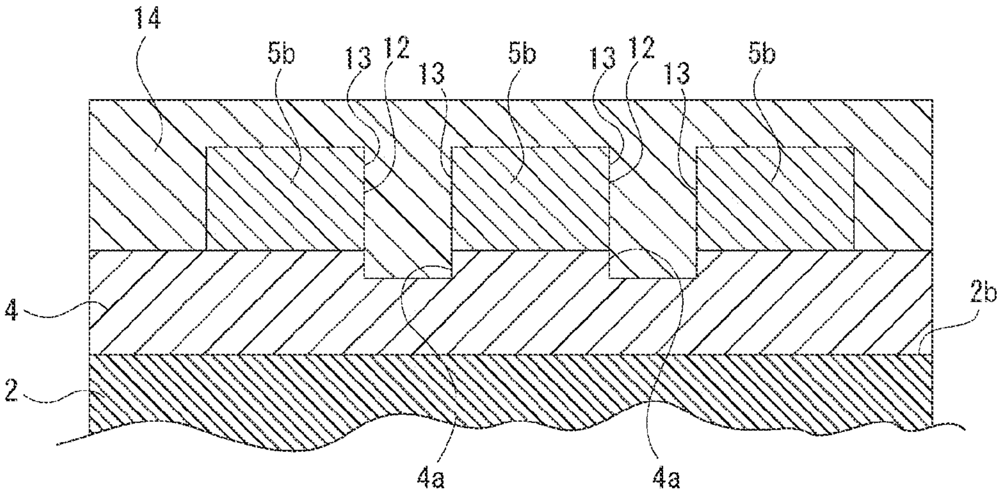
FIG. 10 is a cross-sectional view illustrating a state in which an insulating film is formed.

Next, as illustrated in FIG. 10, a film forming step of forming the insulating film 14 of $SiO_2$, SiON, an organic resin material and the like is performed. The insulating film 14 is formed so as to enter the groove 12 between the side surfaces 13 of the parallel wiring 5*b*.

Figure 11:
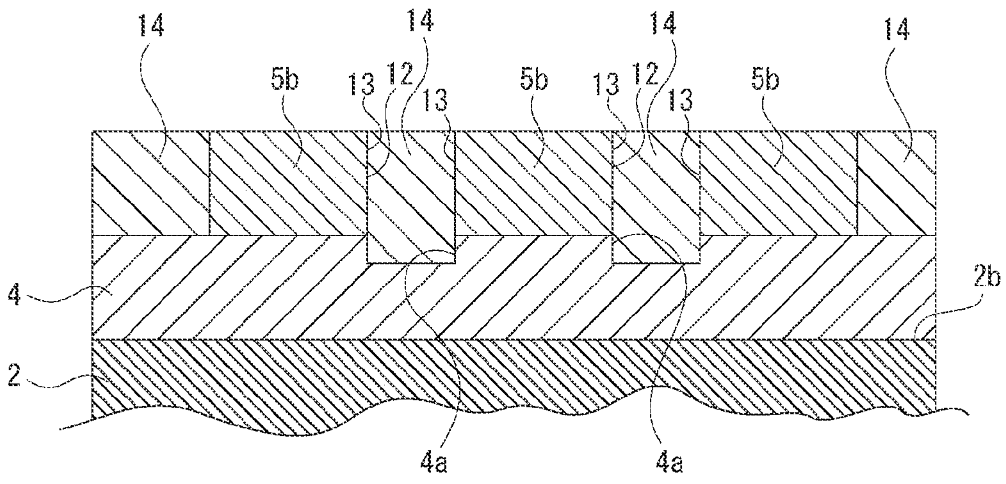
FIG. 11 is a cross-sectional view illustrating a state in which the parallel wiring is exposed by a CMP treatment.

Subsequently, as illustrated in FIG. 11, a chemical mechanical polishing (CMP) treatment is performed on a back surface side of the insulating film 14 to expose the parallel wiring 5*b*. At that time, a height position on the back surface side of the insulating film 14 with respect to the semiconductor substrate 2 is made the same with a height position on a back surface side of the parallel wiring 5*b* with respect to the semiconductor substrate 2.

Next, a lithography step of applying a resist 15 to a portion left as the partition 10 out of the insulating film 14 formed in the groove 12 is performed.

Figure 12:
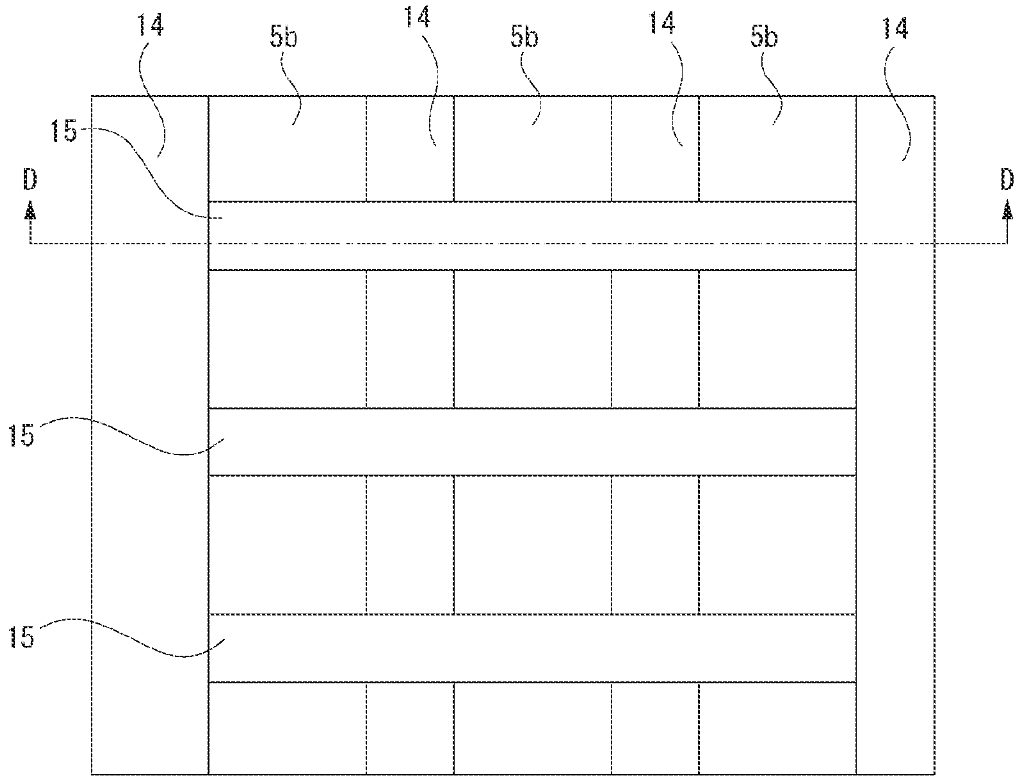
FIG. 12 is a plane view of a back surface side illustrating a state in which a resist is applied.
Figure 13:
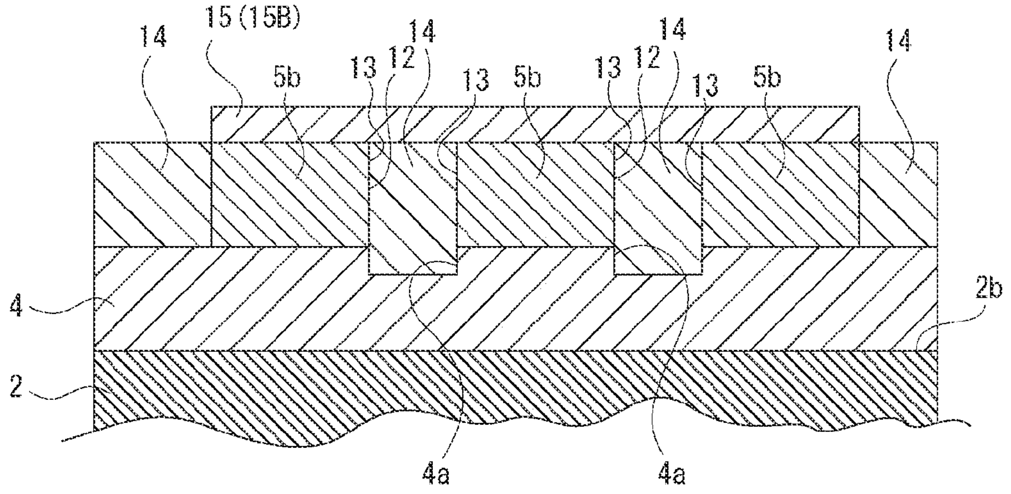
FIG. 13 is a cross-sectional view taken along line D-D in FIG. 12.

FIG. 12 is a plane view as seen from the back surface side of a state in which the resist 15 is applied, and FIG. 13 is a cross-sectional view taken along line D-D in FIG. 12.

As illustrated, strip-shaped resist 15 a longitudinal direction of which is a direction orthogonal to the parallel wiring 5*b* is applied at regular intervals in a direction in which the parallel wiring 5*b* extends.

Figure 14:
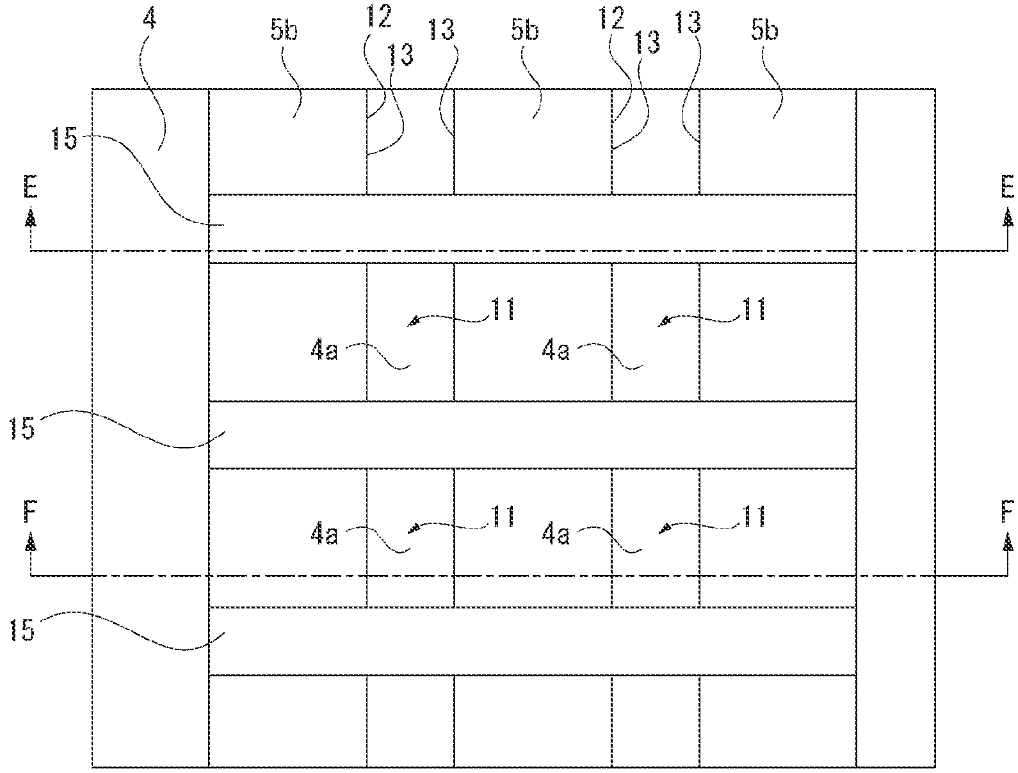
FIG. 14 is a plane view of a back surface side illustrating a state in which an insulating film is removed.

Subsequently, the insulating film 14 not covered with the resist 15 is removed by the etching treatment. FIG. 14 is a plane view as seen from the back surface side of a state in which the insulating film 14 is removed. Furthermore, FIG. 15 is a cross-sectional view taken along line E-E in FIG. 14, and FIG. 16 is a cross-sectional view taken along line F-F in FIG. 14.

Figure 15:
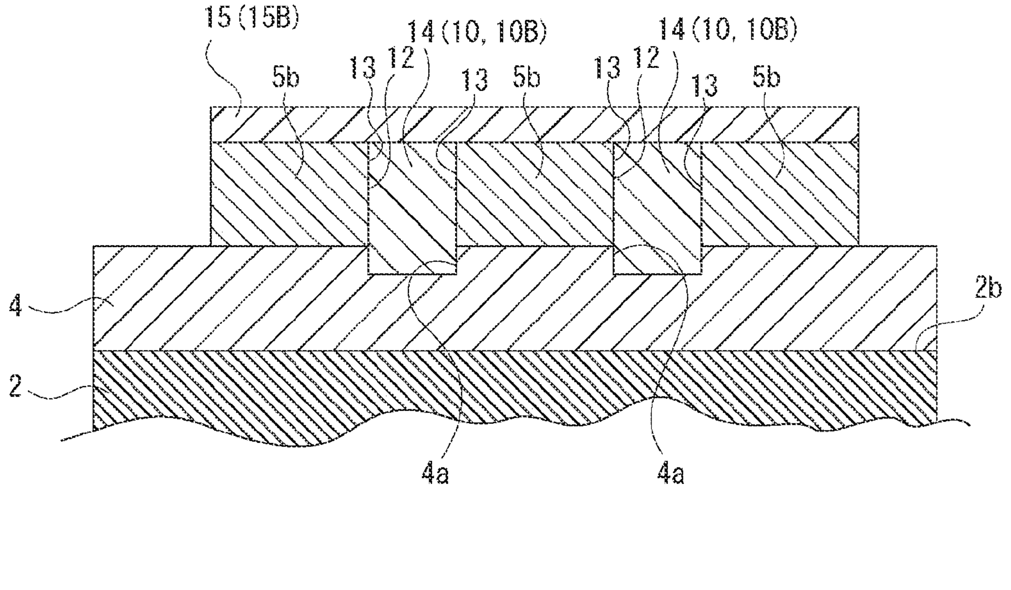
FIG. 15 is a cross-sectional view taken along line E-E in FIG. 14.

As illustrated in FIG. 15, the insulating film 14 protected by the resist 15 remains as the partition 10 in the groove 12.

Figure 16:
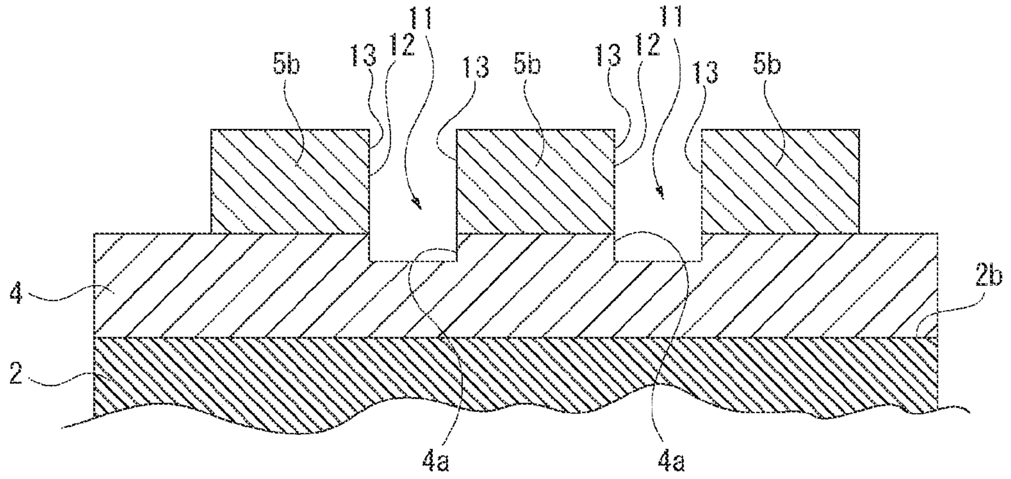
FIG. 16 is a cross-sectional view taken along line F-F in FIG. 14.

In contrast, as illustrated in FIG. 16, the insulating film 14 that is not protected by the resist 15 is removed, and the void 11 is formed.

Next, a treatment of removing the resist 15 is performed. A state in which the resist 15 is removed is illustrated in FIG. 17 as a plane view of the back surface side, FIG. 18 as a cross-sectional view taken along line G-G in FIG. 17, and FIG. 19 as a cross-sectional view taken along line H-H in FIG. 17.

Figure 17:
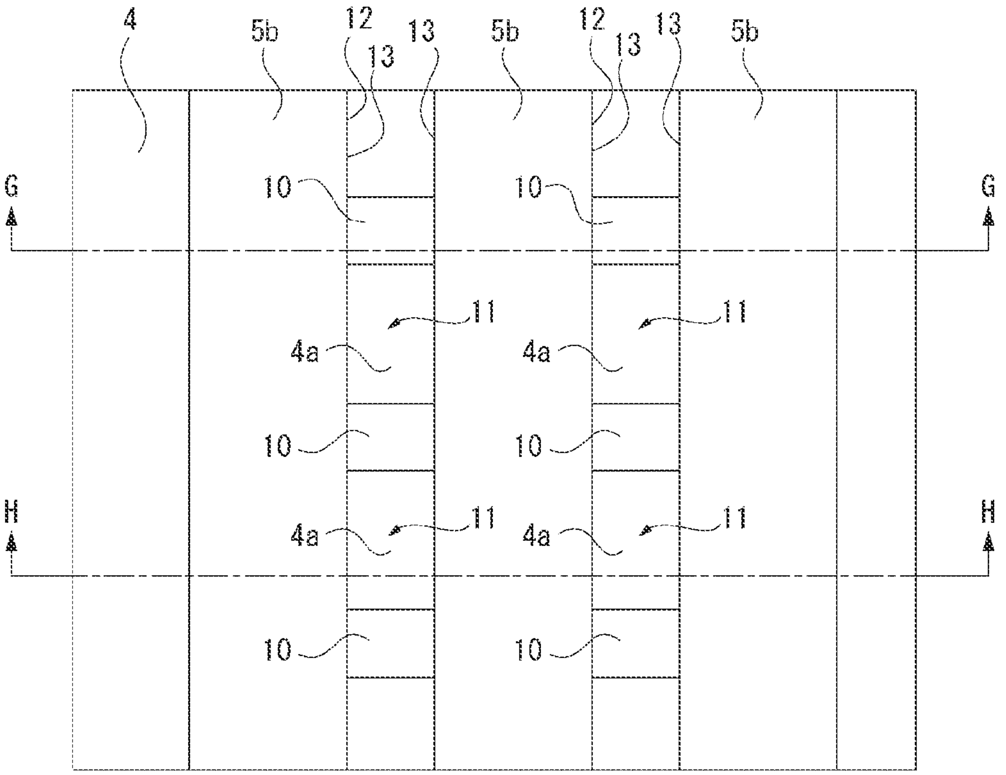
FIG. 17 is a plane view of a back surface side illustrating a state in which the resist is removed.
Figure 18:
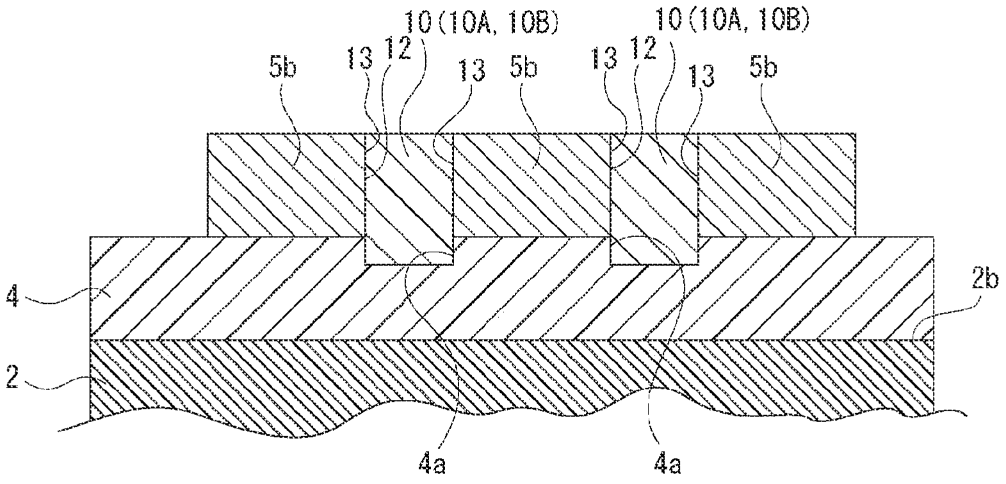
FIG. 18 is a cross-sectional view taken along line G-G in FIG. 17.

As illustrated in FIGS. 17 and 18, the partitions 10 are formed so as to be separated at regular intervals in the groove 12 in the direction in which the parallel wiring 5*b* extends.

Figure 19:
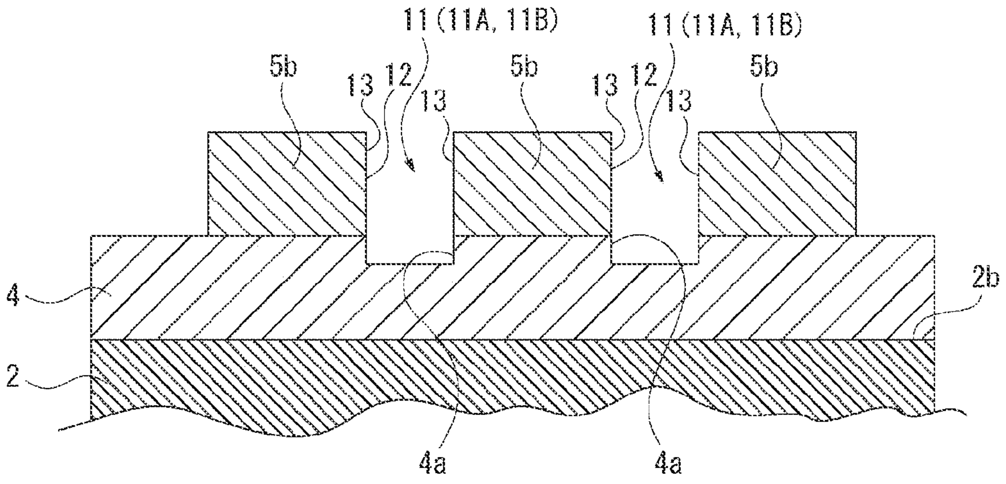
FIG. 19 is a cross-sectional view taken along line H-H in FIG. 17.

Furthermore, as illustrated in FIGS. 17 and 19, the void 11 is formed between the partitions 10 in the groove 12.

In a state in which the partitions 10 and the voids 11 are alternately formed in the groove 12 in the direction in which the parallel wiring 5*b* extends, the protective film 6 is formed on the back surface side of the redistribution layer 5 by the spin coating method.

In a state in which the partition 10 is not formed in the groove 12, a chemical liquid enters the groove 12 in a case where a direction in which the chemical liquid forming the protective film 6 flows coincides with a direction in which the parallel wiring 5*b* extends. Therefore, there is a case where the void is not formed between the pieces of parallel wiring 5*b*, and the inter-wiring capacitance Q of the parallel wiring 5*b* cannot be reduced.

In contrast, the partition 10 and the void 11 both have a rectangular parallelepiped shape. Especially, since the void 11 is not formed as a simple groove but formed into a rectangular parallelepiped shape, it is difficult for the chemical liquid used in the spin coating method to enter the void 11 regardless of the direction in which this flows, and it is possible to stably form the void 11 between the pieces of wiring of the parallel wiring 5*b* as illustrated in FIG. 6. Therefore, the inter-wiring capacitance Q of the parallel wiring 5*b* may be reduced.

Note that, in a case where the protective film 6 is formed by the spin coating method, it is more advantageous to apply dynamic application than static application. By adopting the dynamic application, the chemical liquid is less likely to enter the void 11, the state in which the void 11 is formed may be secured, and a volume of the void 11 that may be formed may be increased. Therefore, the inter-wiring capacitance Q of the parallel wiring 5*b* may be efficiently reduced.

4. VARIATIONS

4-1. First Variation

A first variation is an example in which a cylindrical partition 10A an axial direction of which coincides with a thickness direction of the semiconductor substrate 2 is formed in the groove 12 formed between the pieces of wiring of the parallel wiring 5*b*.

This is specifically described with reference to the accompanying drawings. Note that, steps until the resist 15 is formed are the same. That is, FIGS. 8 to 11 are similar steps, and description thereof is omitted.

After a surface on the back surface side of the parallel wiring 5*b* is exposed by performing the CMP treatment, the lithography step is performed. At the lithography step, circular resists 15A separated at regular intervals in the direction in which the parallel wiring 5*b* extends is applied on the back surface side of the insulating film 14 that enters the groove 12.

Figure 20:
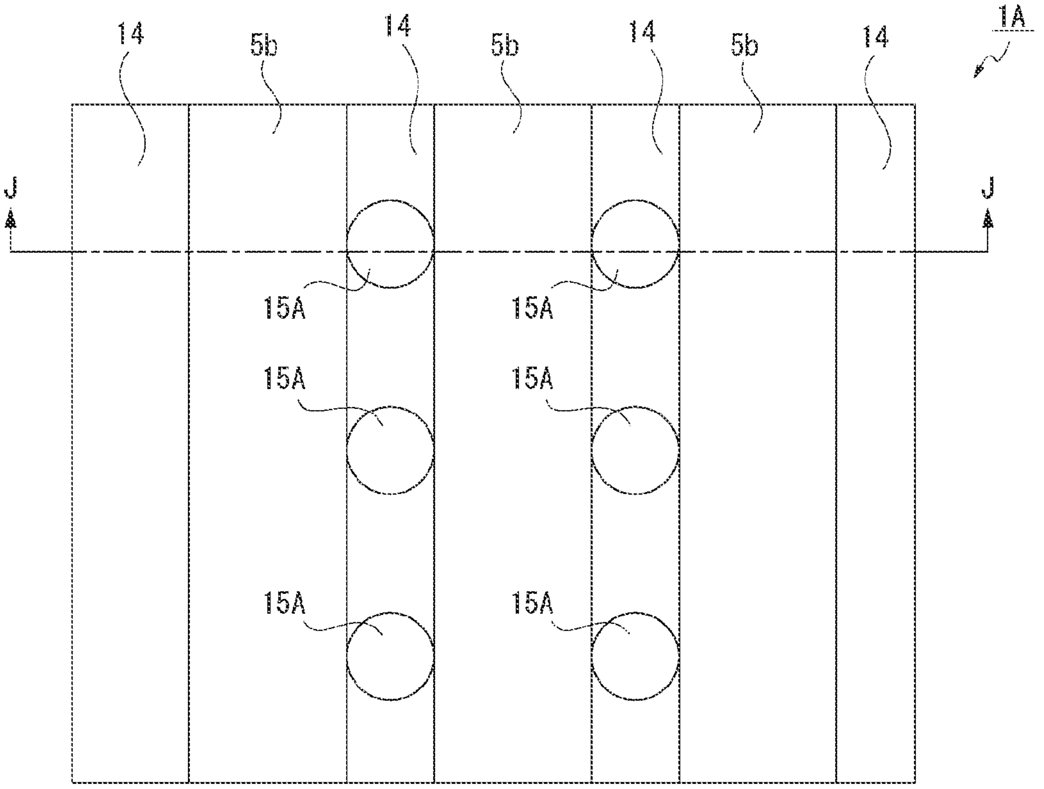
FIG. 20 is a plane view of a back surface side illustrating a state in which a resist is applied in a first variation.
Figure 21:
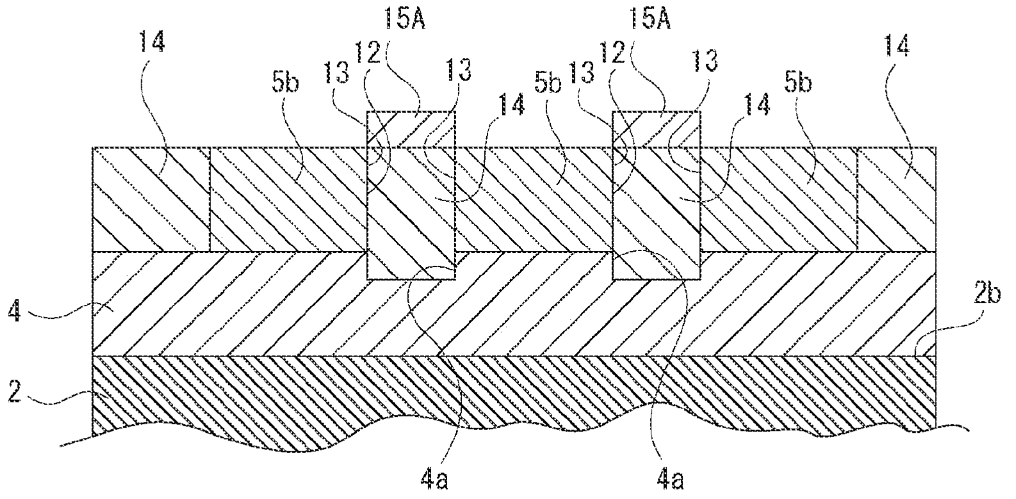
FIG. 21 is a cross-sectional view taken along line J-J in FIG. 20.

FIG. 20 is a plane view on the back surface side in a state in which the resist 15A is applied, and FIG. 21 is a cross-sectional view taken along line J-J in FIG. 20.

Figure 22:
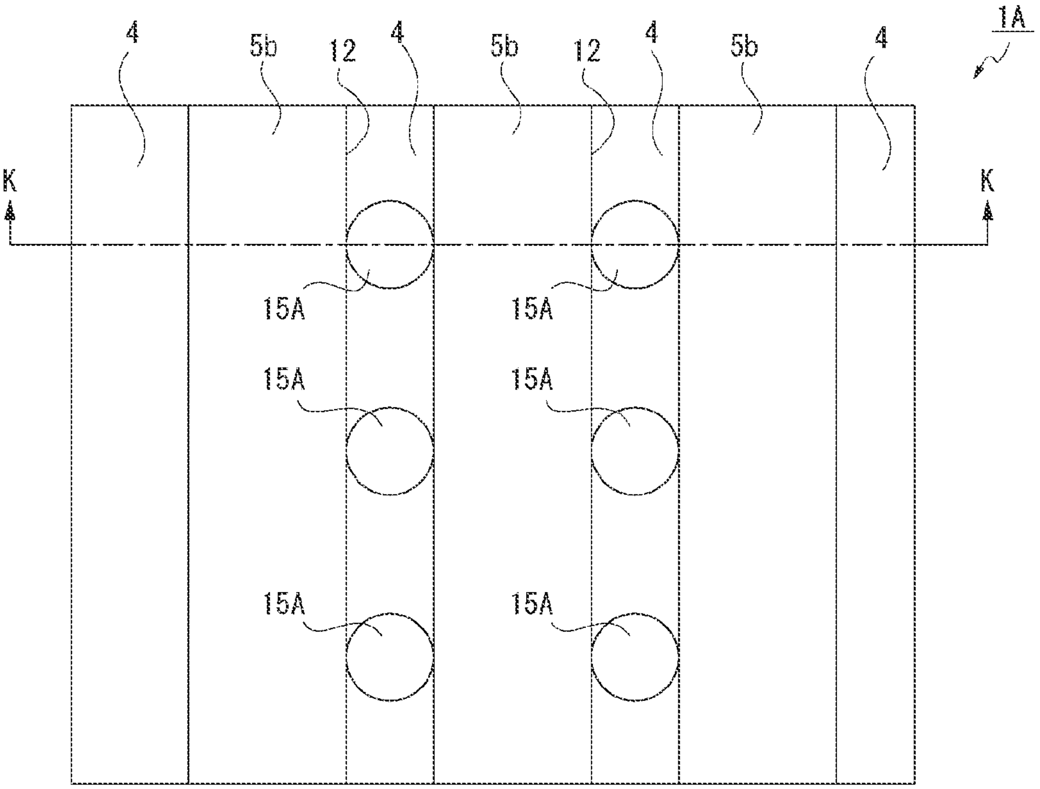
FIG. 22 is a plane view of a back surface side illustrating a state in which an insulating film is removed in a first variation.
Figure 23:
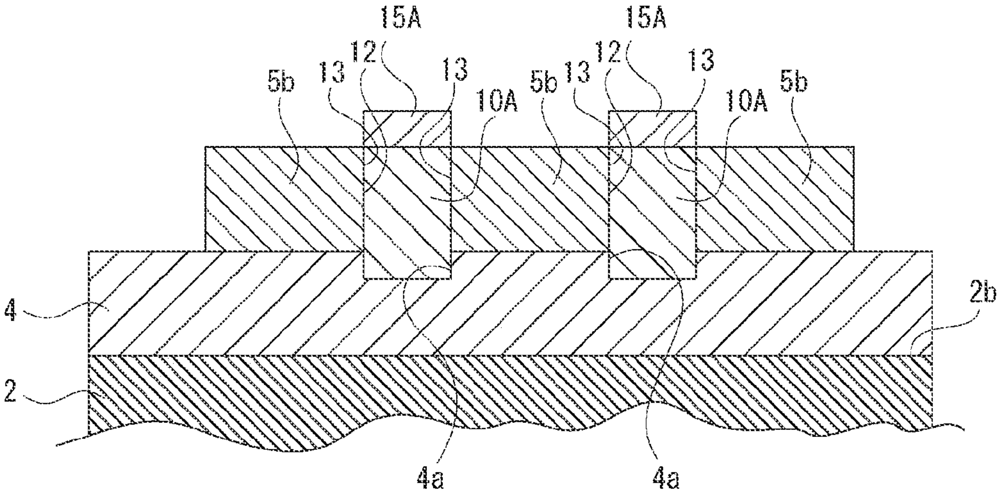
FIG. 23 is a cross-sectional view taken along line K-K in FIG. 22.

Subsequently, FIG. 22 is a plane view on a back surface side of a semiconductor device 1A in a state in which the etching treatment is performed, and FIG. 23 is a cross-sectional view taken along line K-K in FIG. 22.

As illustrated, the cylindrical partitions 10A are formed at regular intervals in the groove 12 in the direction in which the parallel wiring 5*b* extends.

Figure 24:
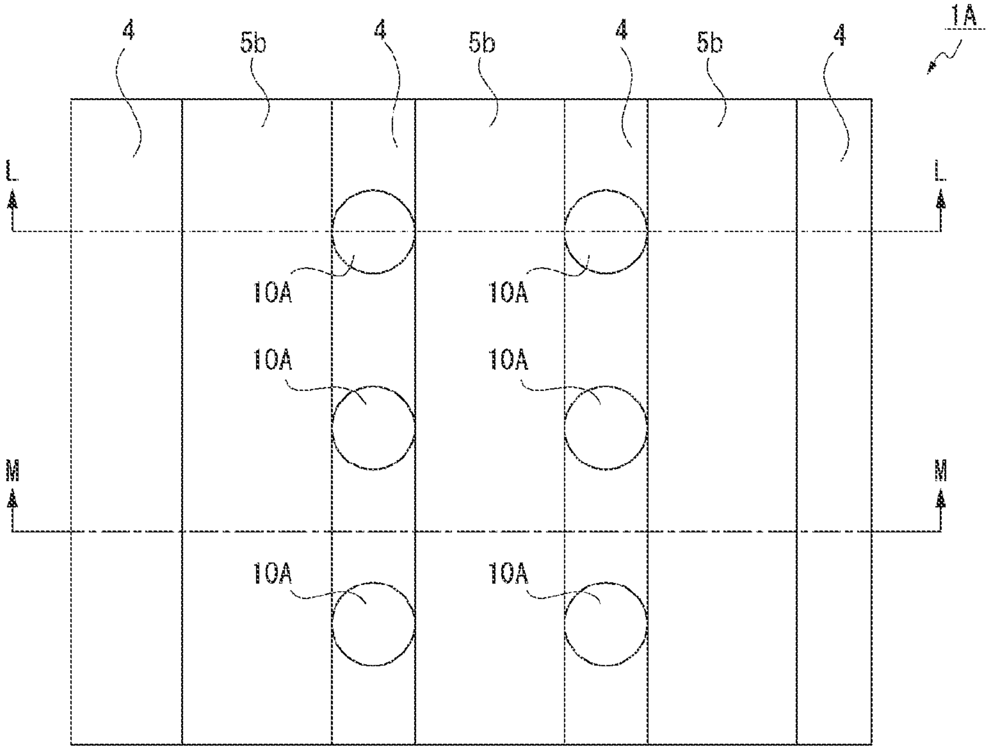
FIG. 24 is a plane view of the back surface side illustrating a state in which the resist is removed in the first variation.

Next, a treatment of removing the resist 15A is performed. FIG. 24 is a plane view on the back surface side of a state in which the resist 15A is removed. Furthermore, a cross-sectional view taken along line L-L in FIG. 24 is similar to that in FIG. 18 described above, and a cross-sectional view taken along line M-M in FIG. 24 is similar to that in FIG. 19 described above.

As illustrated in FIGS. 24 and 19, a void 11A is formed in a portion between the cylindrical partitions 10A arranged in the groove 12.

A side surface of the cylindrical partition 10A comes into contact with the side surface 13 of the parallel wiring 5*b*.

Therefore, most of the side surface 13 of the parallel wiring 5*b* is adjacent to the void 11A, so that the inter-wiring capacitance Q may further be reduced.

4-2. Second Variation

A second variation is an example in which a cylindrical hole formed in the groove 12 is made the void 11. Note that, steps until the resist 15 is formed are the same. That is, FIGS. 8 to 11 are similar steps, and description thereof is omitted.

After a surface on the back surface side of the parallel wiring 5*b* is exposed by performing the CMP treatment, the lithography step is performed. At the lithography step, a resist 15B is applied in such a manner that the insulating film 14 is removed in a cylindrical shape so as to be separated at regular intervals in a direction in which the parallel wiring 5*b* extends on the back surface side of the insulating film 14 that enters the groove 12.

Figure 25:
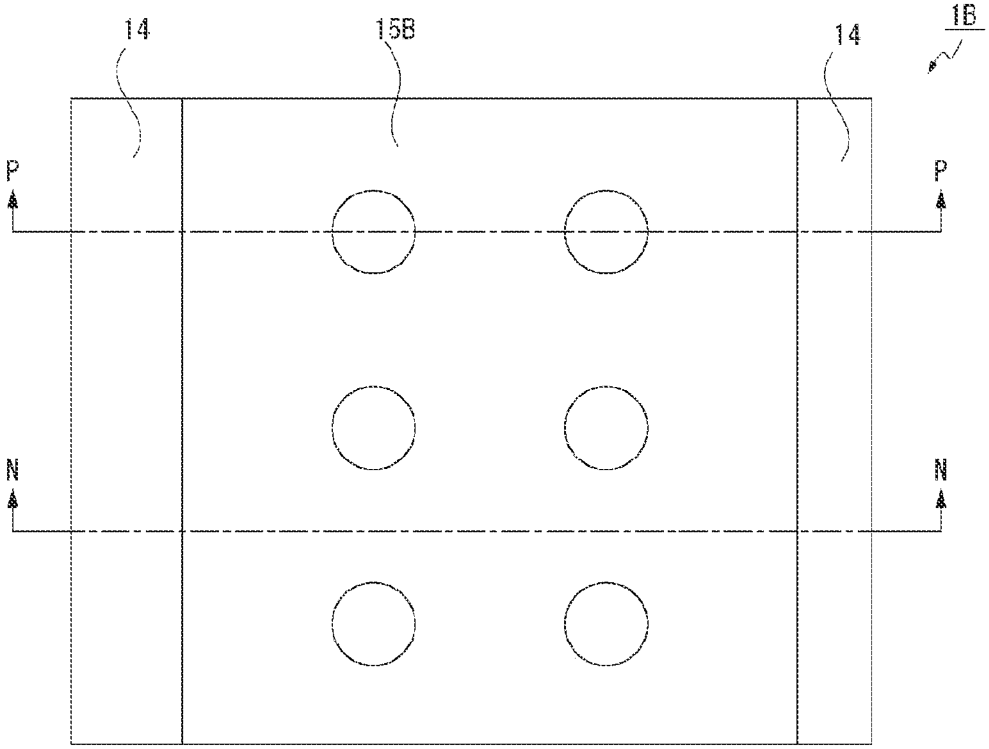
FIG. 25 is a plane view of a back surface side illustrating a state in which a resist is applied in a second variation.

FIG. 25 is a plane view on the back surface side of a semiconductor device 1B in a state in which the resist 15B is applied. Note that, a cross-sectional view taken along line N-N in FIG. 25 is similar to that in FIG. 13 described above. Furthermore, a cross-sectional view taken along line P-P in FIG. 25 is illustrated in FIG. 26.

Figure 26:
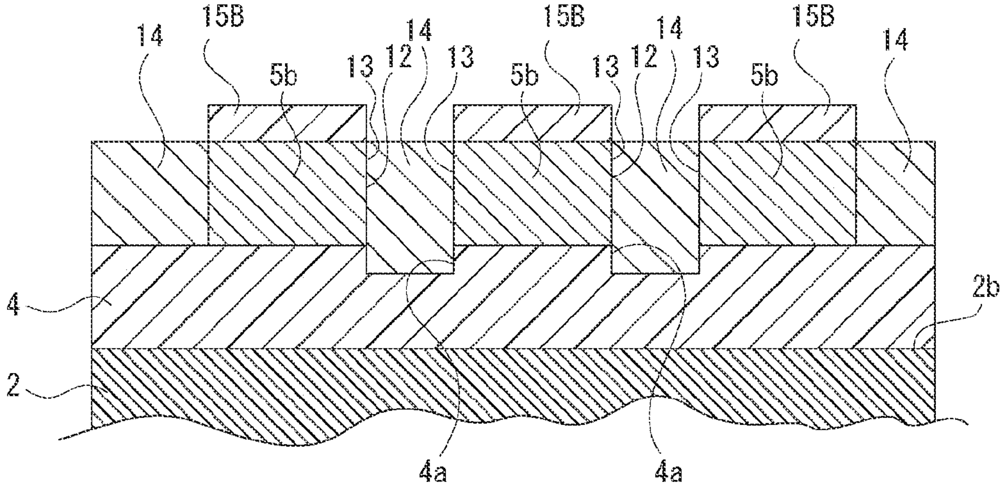
FIG. 26 is a cross-sectional view taken along line P-P in FIG. 25.

As illustrated in FIGS. 25 and 26, the insulating film 14 located in the groove 12 is provided with circular portions to which the resist 15B is not applied at regular intervals in the direction in which the parallel wiring 5*b* extends.

Figure 27:
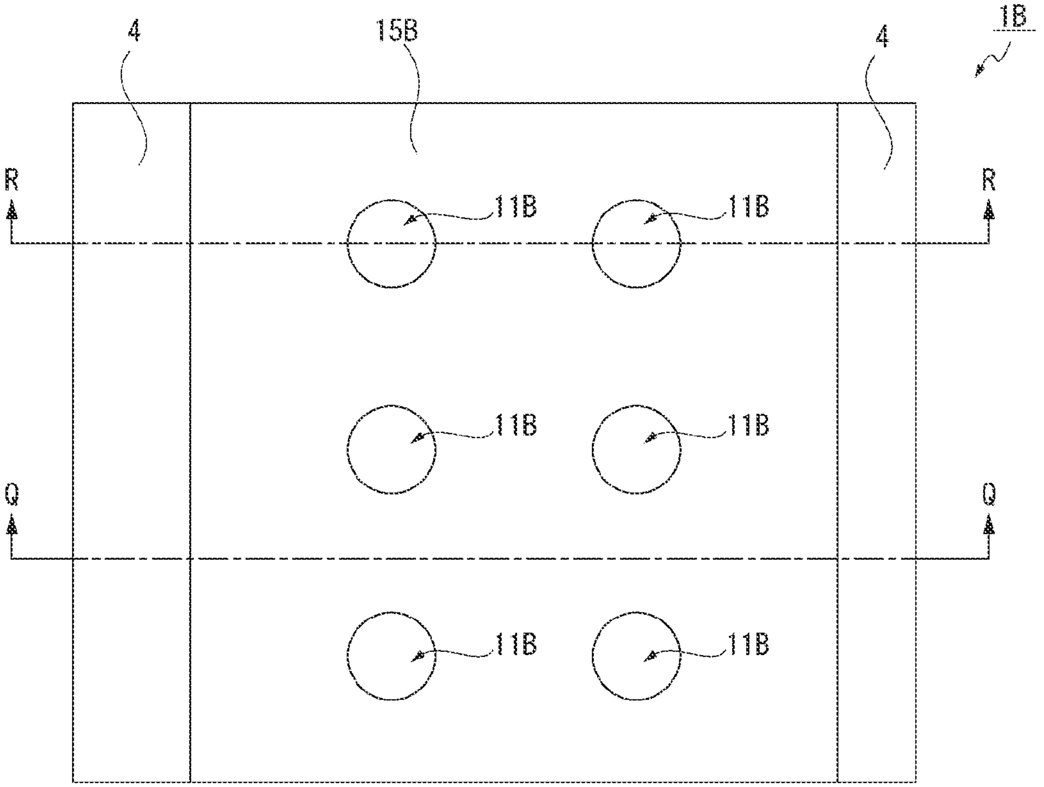
FIG. 27 is a plane view of the back surface side illustrating a state in which an insulating film is removed in the second variation.
Figure 28:
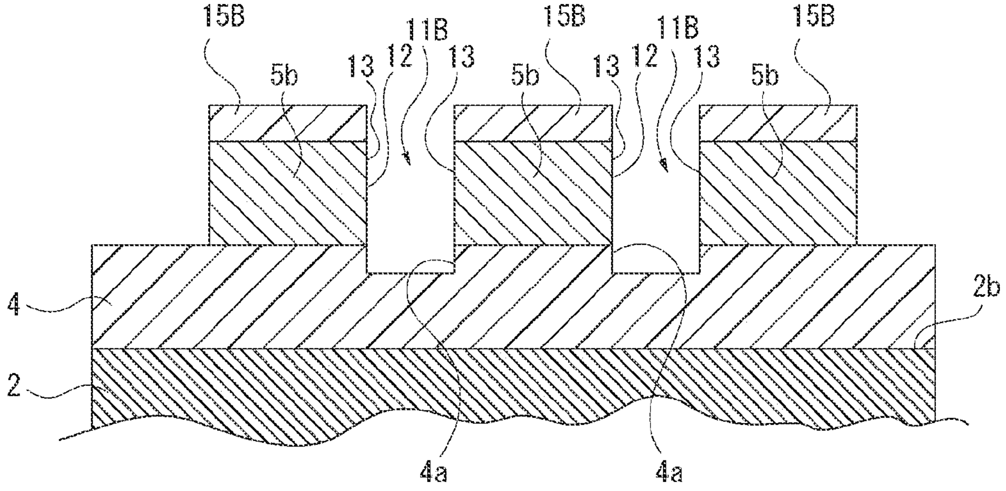
FIG. 28 is a cross-sectional view taken along line R-R in FIG. 27.

Subsequently, a plane view on the back surface side of the semiconductor device 1B subjected to the etching treatment is illustrated in FIG. 27. Note that, a cross-sectional view taken along line Q-Q in FIG. 27 is similar to that in FIG. 15 described above. Furthermore, a cross-sectional view taken along line R-R in FIG. 27 is illustrated in FIG. 28.

As illustrated, cylindrical holes 16 are formed at regular intervals in the groove 12 in the direction in which the parallel wiring 5*b* extends.

Figure 29:
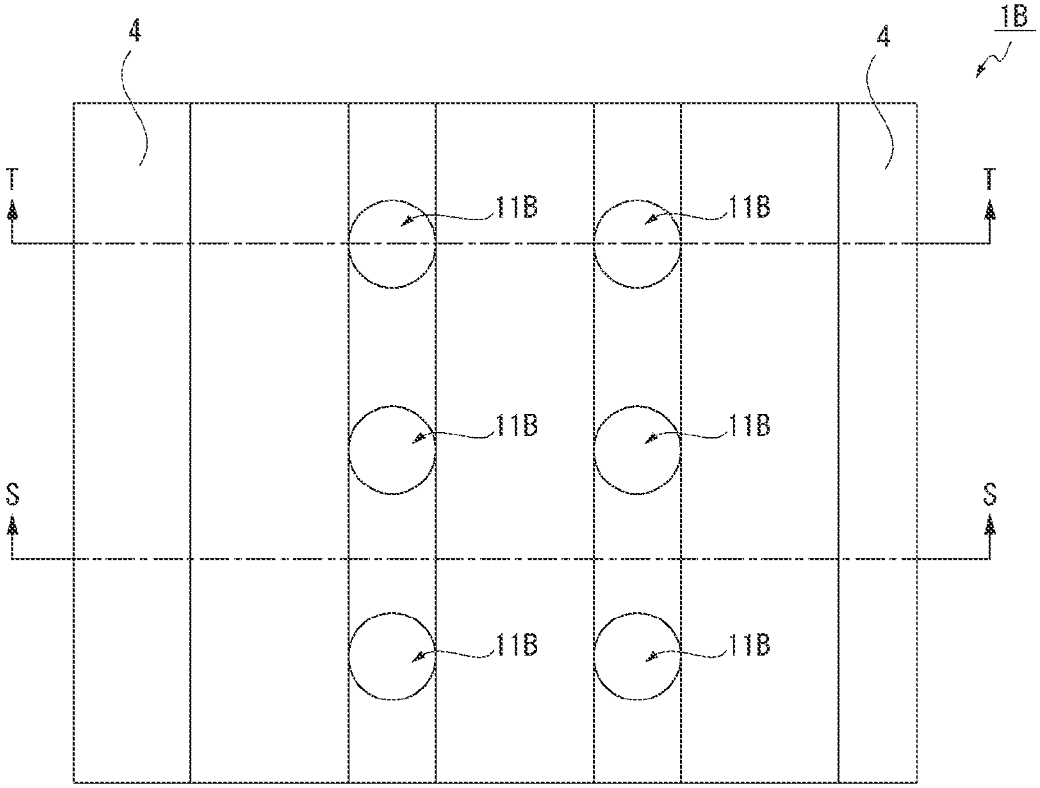
FIG. 29 is a plane view of the back surface side illustrating a state in which the resist is removed in the second variation.

Next, a treatment of removing the resist 15B is performed. FIG. 29 is a plane view on the back surface side of a state in which the resist 15B is removed. Note that, a cross-sectional view taken along line S-S in FIG. 29 is similar to that in FIG. 18 described above, and a cross-sectional view taken along line T-T in FIG. 29 is similar to that in FIG. 19 described above.

As illustrated in FIGS. 29 and 19, cylindrical holes 16 separated at regular intervals in the groove 12 are formed as voids 11B, and the insulating film 14 remains as a partition 10B in a portion therebetween.

In a case where viscosity of the chemical liquid used in the spin coating method is low at subsequent steps, there is a possibility that the chemical liquid enters the void 11A and the void 11A disappears in the first variation and the like. However, according to this variation, even in a case where the protective film 6 is formed using a chemical liquid having low viscosity, an opening of the void 11B is made small, so that the void 11B may be stably formed.

Therefore, the inter-wiring capacitance Q regarding the parallel wiring 5*b* may be surely reduced.

4-3. Third Variation

A third variation is an example in which a distance between the partitions 10, that is, a length of the void 11 in the direction in which the parallel wiring 5*b* extends is changed according to a length of the inter-wiring distance d of the parallel wiring 5*b*.

Specifically, it is described with reference to FIG. 30, which is a plane view on a back surface side. Note that, the protective film 6 is not illustrated in FIG. 30.

As illustrated, first parallel wiring 5*b*1 having an inter-wiring distance d1 and a second parallel wiring 5*b*2 having an inter-wiring distance d2 are formed on the back surface side of the insulating resin film 4.

The inter-wiring distance d1 is made shorter than the inter-wiring distance d2. That is, the first parallel wiring 5*b*1 is formed as a wiring pattern relatively finer than the second parallel wiring 5*b*2.

In this case, the first parallel wiring 5*b*1 have a smaller variable d in Expression (2) described above than the second parallel wiring 5*b*2, so that the capacitance C is larger. Therefore, in order to reduce the capacitance C, the contact area between the void 11 having the small relative dielectric conductivity Er and the side surface 13 of the first parallel wiring 5*b*1 is increased so that average relative dielectric conductivity Er of the first parallel wiring 5*b*1 is decreased.

Figure 30:
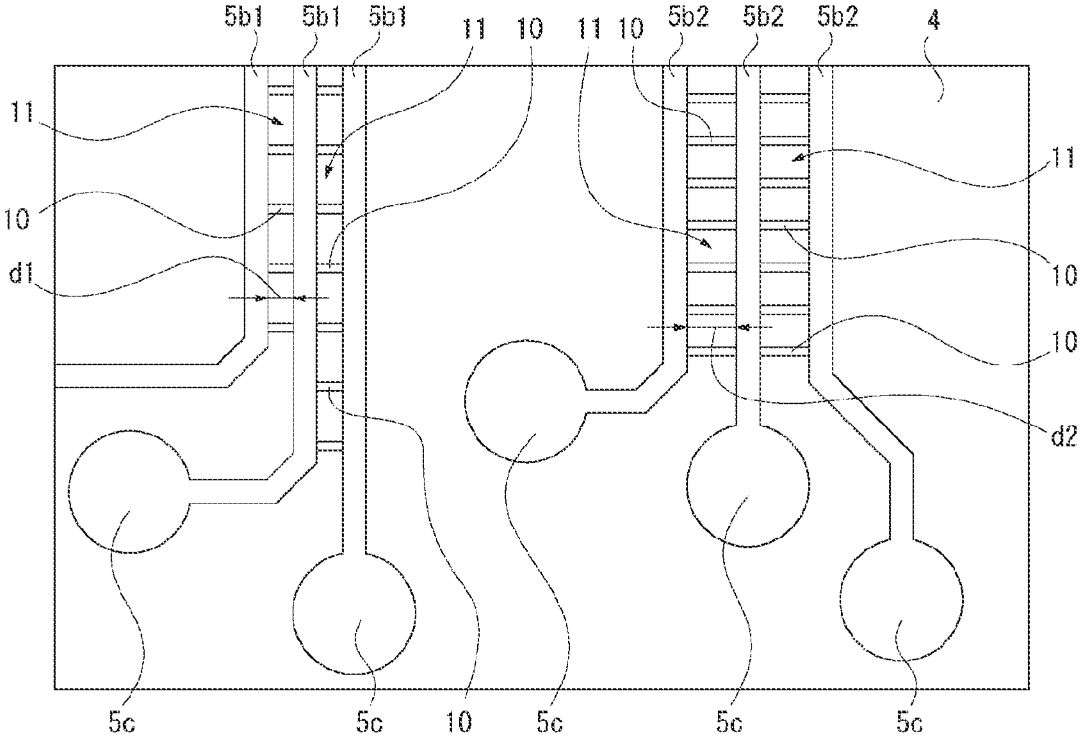
FIG. 30 is a diagram for explaining a third variation, a plane view on a back surface side illustrating a state in which arrangement interval of partitions is changed according to an inter-wiring distance.

That is, as illustrated in FIG. 30, the inter-wiring capacitance Q in the first parallel wiring 5*b*1 that is made finer may be reduced by increasing an arrangement interval of the partitions 10.

Note that, even in consideration of ease of entry of a liquid agent into the void 11 when the protective film 6 is formed by the spin coating method, it is suitable that the arrangement interval of the partitions 10 is made wider in the first parallel wiring 5*b*1 that is made finer than the second parallel wiring 5*b*2.

That is, to make the parallel wiring 5*b* finer is to shorten the inter-wiring distance d, so that the liquid agent is less likely to enter the void 11. Therefore, even if the arrangement interval of the partitions 10 is increased in consideration of this, the liquid agent does not enter the void 11, and the protective film 6 may be formed in a state in which the void 11 is formed without any problem.

4-4. Fourth Variation

A fourth variation is an example in which the partitions 10 adjacent to each other in the groove 12 of the parallel wiring 5*b* are non-parallel.

This is specifically described with reference to FIG. 31. The illustrated parallel wiring 5*b* is formed into a non-linear shape as a whole by making straight lines extending in different directions continuous.

In this manner, regarding the parallel wiring 5*b* formed by curved lines and the parallel wiring 5*b* formed by two or more straight lines, the partitions 10 formed in the groove 12 are non-parallel.

That is, the partition 10 is formed in such a manner that a longitudinal direction thereof is perpendicular to the direction in which adjacent pieces of parallel wiring 5*b* extend.

Note that, in a case where the partitions 10 are arranged so as to be separated at a predetermined interval, the partition 10 may be formed so as to be adjacent to the parallel wiring 5*b* on an inner peripheral side at a predetermined interval, or the partition 10 may be formed so as to be adjacent to the parallel wiring 5*b* on an outer peripheral side at a predetermined interval.

4-5. Other Variations

In another variation, an application mode of the semiconductor device 1 (1A, 1B) is described.

Various examples such as a logic circuit device, an image sensor device, a memory device, and an interposer may be considered as the semiconductor device 1.

Figure 32:
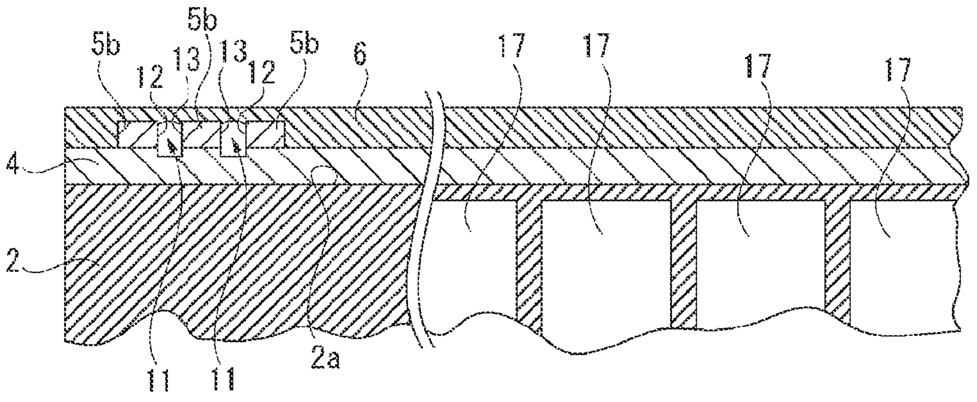
FIG. 32 is a cross-sectional view illustrating a state in which the present technology is applied to a semiconductor device as an image sensor.

As an example, an image sensor device is illustrated in FIG. 32. Note that, in FIG. 32, illustration of the wiring layer 3 formed on the front surface 2*a* side of the semiconductor substrate 2 is omitted.

As illustrated, photoelectric conversion elements 17 are provided in a two-dimensional array in a central portion of the semiconductor substrate 2, and the insulating resin film 4 and the protective film 6 are formed on a back surface side thereof.

The photoelectric conversion element 17 is not formed on the outer peripheral portion of the semiconductor substrate 2, and the insulating resin film 4, the redistribution layer 5, and the protective film 6 are formed on the back surface side of the semiconductor substrate 2. Then, in the groove 12 formed between the pieces of wiring of the parallel wiring 5*b* in the redistribution layer 5, the partition 10 and the void 11 as described above are alternately formed.

In this manner, since the redistribution layer 5, the partition 10, and the void 11 are formed in a portion in which the photoelectric conversion element 17 is not formed in the semiconductor substrate 2, the inter-wiring capacitance Q regarding the parallel wiring 5*b* may be reduced without hindering incidence of light on the photoelectric conversion element 17.

5. SUMMARY

As described in each example described above, a semiconductor device 1 (1A, 1B) includes a semiconductor substrate 2, a wiring layer 3 including an electrode pad 7, the wiring layer 3 formed on a first surface (front surface 2*a*) of the semiconductor substrate 2, a redistribution layer 5 including wiring electrically connected to the electrode pad 7 via a via (through electrode TSV), the redistribution layer 5 formed on a second surface (back surface 2*b*) side opposite to the first surface of the semiconductor substrate 2, a protective film 6 formed on a surface (back surface side) on a side opposite to the semiconductor substrate 2 in the redistribution layer 5, and a partition 10 (10A, 10B) including an insulating material, the partition 10 arranged between pieces of wiring (pieces of wiring of parallel wiring 5*b*, first parallel wiring 5*b*1, second parallel wiring 5*b*2) in the redistribution layer 5, in which the partition 10 and a void 11 (11A, 11B) are alternately formed between the pieces of wiring in a direction in which the wiring extends.

Therefore, the void 11 surrounded by the two pieces of wiring (two pieces of parallel wiring 5*b*) and the two partitions 10 is formed before the protective film 6 is formed.

Therefore, the protective film 6 may be formed with the void 11 secured. Then, by decreasing a contact area between the two pieces of wiring and the partition 10, an inter-wiring capacitance Q regarding the two pieces of wiring may be reduced. This is especially effective in a case where the protective film 6 is formed using the spin coating method. That is, the void 11 may be inevitably formed between the pieces of wiring only by forming the protective film 6 as usual by the spin coating method.

Furthermore, by reducing the inter-wiring capacitance Q, it is possible to manufacture the semiconductor device 1 capable of operating at a high speed.

As described above, the insulating material used for forming the partition 10 (10A, 10B) may be any of SiOx, SiOxNy, and an insulating organic resin. Note that, x and y are variables representing natural numbers.

Therefore, a certain insulation property is secured in the partition 10.

Therefore, the dielectric constant of the partition 10 is reduced, and the inter-wiring capacitance regarding the two pieces of wiring may be further reduced.

As described in the third variation with reference to FIG. 29, in the semiconductor device 1 (1A, 1B), two pieces of wiring (two pieces of first parallel wiring 5*b*1) having a first inter-wiring distance d1 and two pieces of wiring (two pieces of second parallel wiring 5*b*2) having a second inter-wiring distance d2 may be formed in the redistribution layer 5, the first inter-wiring distance d1 may be made shorter than the second inter-wiring distance d2, and an interval between partitions 10 arranged between the two pieces of wiring having the first inter-wiring distance d1, the partitions 10 adjacent to each other in a direction in which the wiring extends may be made larger than an interval between the partitions 10 arranged between the two pieces of wiring having the second inter-wiring distance d2, the partitions 10 adjacent to each other in a direction in which the wiring extends.

Furthermore, in the semiconductor device 1 (1A, 1B), the interval between the partitions 10 (10A, 10B) arranged between the two pieces of wiring, the partitions 10 adjacent to each other in the direction in which the wiring extends may be made larger as the inter-wiring distance d regarding the two pieces of wiring (two pieces of parallel wiring 5*b*) wired in the redistribution layer 5 is shorter.

Therefore, the contact area with the partition 10 is further decreased regarding the two pieces of wiring in which the inter-wiring capacitance Q increases due to a short inter-wiring distance d.

Therefore, this prevents a decrease in effect of reducing the inter-wiring capacitance Q.

As described in the first variation with reference to each of FIGS. 20 to 24, in a semiconductor device 1A, a partition 10A may have a cylindrical shape an axial direction of which coincides with the stacking direction of the redistribution layer 5 with respect to the semiconductor substrate 2.

That is, the side surface of the cylindrical partition 10A comes into contact with the side surface 13 of the parallel wiring 5*b*.

Therefore, the contact area between the wiring and the partition 10A is further decreased, and the inter-wiring capacitance Q may be further reduced.

As described with reference to FIGS. 4 and 5, in the semiconductor device 1, the partition 10 may have a rectangular parallelepiped shape.

Therefore, the void 11 adjacent to the partition 10 is also a rectangular parallelepiped void.

Therefore, the area with which the wiring (parallel wiring 5*b*) is adjacent to the void 11 is made larger, and the inter-wiring capacitance Q may be reduced.

As described with reference to each of FIGS. 25 to 28, the void 11B of the semiconductor device 1B may be a hole 16 formed in the insulating material that enters between the pieces of wiring (between the pieces of wiring of the parallel wiring 5*b*).

Therefore, a hole-shaped void 11B is formed between the partitions 10B.

Therefore, the inter-wiring capacitance Q regarding the two pieces of wiring arranged on both sides of the void 11B may be further reduced.

As described with reference to each drawing such as FIG. 9, in the semiconductor device 1 (1A, 1B), the insulating resin film 4 may be formed between the semiconductor substrate 2 and the redistribution layer 5, and the void 11 (11A, 11B) may be formed as a space reaching the inside of the insulating resin film 4, that is, as a space including a recess (recess groove 4*a*) formed in the insulating resin film 4.

Therefore, the void 11 deeper than the height of the wiring (parallel wiring 5*b*) is formed.

Therefore, since the side surface 13 of the two pieces of wiring may be surely made adjacent to the void, the inter-wiring capacitance Q may be surely reduced. Furthermore, since the void 11 is formed by digging down to the insulating resin film 4, ion migration may be reduced.

Figure 31:
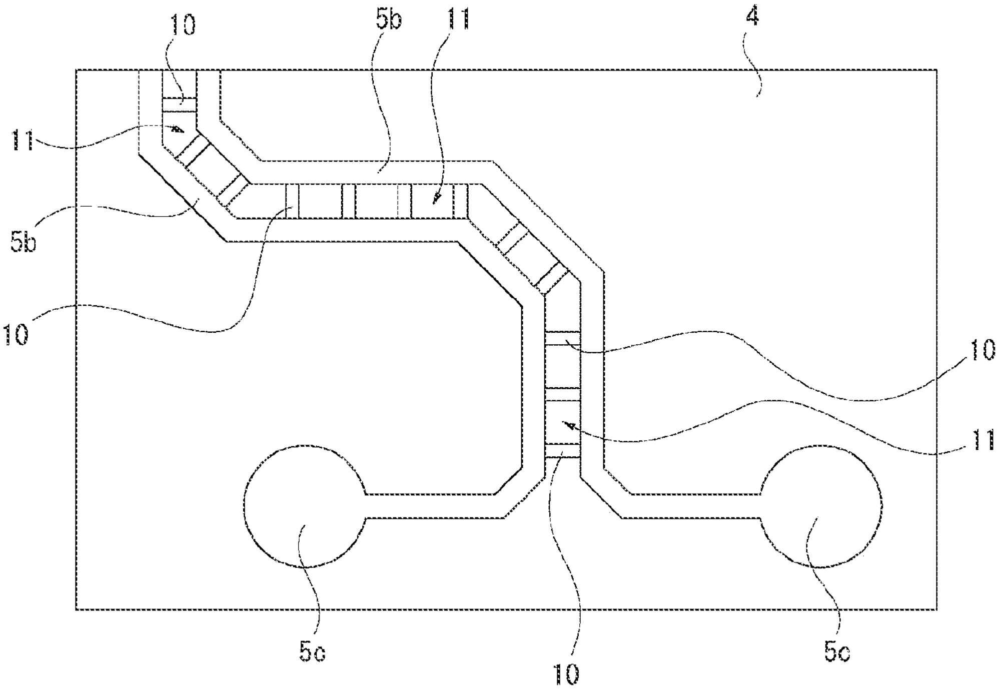
FIG. 31 is a diagram for explaining a fourth variation, a plane view on a back surface side illustrating a state in which a partition is formed between pieces of wiring of parallel wiring formed into a non-linear shape.

As described in other variations with reference to FIG. 31 and the like, in the semiconductor device 1, photoelectric conversion elements 17 that perform photoelectric conversion may be formed in a two-dimensional array in the semiconductor substrate 2.

Therefore, the void 11 is formed between the pieces of wiring of the redistribution layer 5 in the semiconductor device 1 serving as an image sensor and the like.

Therefore, since the inter-wiring capacitance Q may be reduced, this is suitable for high-speed driving of the image sensor.

A semiconductor device manufacturing method according to the present technology alternatively forms, in a semiconductor device 1 (1A, 1B) including a semiconductor substrate 2, a wiring layer 3 including an electrode pad 7, the wiring layer 3 formed on a first surface (front surface 2*a*) of the semiconductor substrate 2, a redistribution layer 5 including wiring electrically connected to the electrode pad 7 via a via (through electrode TSV), the redistribution layer 5 formed on a second surface (back surface 2*b*) side opposite to the first surface of the semiconductor substrate 2, a protective film 6 formed on a surface on a side opposite to the semiconductor substrate 2 in the redistribution layer 5, and a partition 10 including an insulating material, the partition 10 arranged between pieces of wiring (parallel wiring 5*b*) in the redistribution layer 5, the partition 10 and a void 11 between the pieces of wiring in a direction in which the wiring extends.

Furthermore, the manufacturing method alternately forms, in the semiconductor substrate 2 on the first surface (front surface 2*a*) of which the wiring layer 3 including the electrode pad 7 is formed and on the second surface (back surface 2*b*) side of which the redistribution layer 5 including the wiring electrically connected to the electrode pad 7 via the via (through electrode TSV) is formed, the second surface side opposite to the first surface, the partition 10 and the void 11 in the direction in which the wiring extends between the pieces of wiring in the redistribution layer 5.

By such manufacturing method, the semiconductor device 1 (1A, 1B) having the above-described various functions and effects may be manufactured.

The semiconductor device manufacturing method may form the void 11 (11A, 11B) by forming the protective film 6 by the spin coating method.

The chemical liquid flows on the back surface side of the redistribution layer 5 by the spin coating method to form the protective film 6, so that the void 11 may be easily formed.

Note that the effects described in the present specification are merely illustrative and are not limited; there may be additional effects.

Furthermore, the above-described examples may be combined in any way, and the above-described various functions and effects may be obtained even in a case where various combinations are used.

6. PRESENT TECHNOLOGY

The present technology may also adopt the following configurations.

(1)

A semiconductor device including:

a semiconductor substrate;

a wiring layer including an electrode pad, the wiring layer formed on a first surface of the semiconductor substrate;

a redistribution layer including wiring electrically connected to the electrode pad via a via, the redistribution layer formed on a second surface side opposite to the first surface of the semiconductor substrate;

a protective film formed on a surface on a side opposite to the semiconductor substrate in the redistribution layer; and a partition formed by an insulating material, the partition arranged between pieces of wiring in the redistribution layer, in which the partition and a void are alternately formed between the pieces of wiring in a direction in which the wiring extends.

(2)

The semiconductor device according to (1) above, in which the insulating material is any one of SiOx, SiOxNy, and an insulating organic resin.

(3)

The semiconductor device according to (1) or (2) above, in which two pieces of wiring having a first inter-wiring distance and two pieces of wiring having a second inter-wiring distance are formed in the redistribution layer, the first inter-wiring distance is made shorter than the second inter-wiring distance, and an interval between partitions arranged between the two pieces of wiring having the first inter-wiring distance, the partitions adjacent to each other in a direction in which the wiring extends is made larger than an interval between the partitions arranged between the two pieces of wiring having the second inter-wiring distance, the partitions adjacent to each other in a direction in which the wiring extends.

(4)

The semiconductor device according to (3) above, in which the interval between the partitions arranged between the two pieces of wiring, the partitions adjacent to each other in the direction in which the wiring extends is made larger as the inter-wiring distance regarding the two pieces of wiring wired in the redistribution layer is shorter.

(5)

The semiconductor device according to any one of (1) to (4), in which the partition has a cylindrical shape an axial direction of which coincides with a stacking direction of the redistribution layer with respect to the semiconductor substrate.

(6)

The semiconductor device according to any one of (1) to (4) above, in which the partition has a rectangular parallelepiped shape.

(7)

The semiconductor device according to any one of (1) to (6) above, in which the void is a hole formed in an insulating material that enters between the pieces of wiring.

(8)

The semiconductor device according to any one of (1) to (7) above, in which an insulating resin film is formed between the semiconductor substrate and the redistribution layer, and the void is formed as a space reaching the inside of the insulating resin film.

(9)

The semiconductor device according to any one of (1) to (8) above, in which photoelectric conversion elements that perform photoelectric conversion are formed in a two-dimensional array in the semiconductor substrate.

(10)

A semiconductor device manufacturing method including:

alternately forming, in a semiconductor substrate on a first surface of which a wiring layer including an electrode pad is formed and on a second surface side of which a redistribution layer including wiring electrically connected to the electrode pad via a via is formed, the second surface side opposite to the first surface, a partition and a void in a direction in which the wiring extends between pieces of wiring in the redistribution layer.

(11)

The semiconductor device manufacturing method according to (10) above, in which the void is formed by forming a protective film by a spin coating method.

REFERENCE SIGNS LIST

1, 1A, 1B Semiconductor device
2 Semiconductor substrate
2*a* Front surface (first surface)
2*b* Back surface (second surface)
3 Wiring layer
4 Insulating resin film
5 Redistribution layer
6 Protective film
7 Electrode pad
10, 10A, 10B Partition
11, 11A, 11B Void
12 Groove
16 Hole
17 Photoelectric conversion element
TSV Through-electrode (Via)

What is claimed is:

1. A semiconductor device, comprising:

a semiconductor substrate;

a wiring layer including an electrode pad, the wiring layer formed on a first surface of the semiconductor substrate;

a redistribution layer including wiring electrically connected to the electrode pad via a via, the redistribution layer formed on a second surface side opposite to the first surface of the semiconductor substrate;

a protective film formed on a surface on a side opposite to the semiconductor substrate in the redistribution layer; and a partition formed by an insulating material, the partition arranged between pieces of wiring in the redistribution layer, wherein the partition and a void are alternately formed between the pieces of wiring in a direction in which the wiring extends, wherein two pieces of wiring having a first inter-wiring distance and two pieces of wiring having a second inter-wiring distance are formed in the redistribution layer, wherein the first inter-wiring distance is made shorter than the second inter-wiring distance, and wherein an interval between partitions arranged between the two pieces of wiring having the first inter-wiring distance, the partitions adjacent to each other in a direction in which the wiring extends is made larger than an interval between the partitions arranged between the two pieces of wiring having the second inter-wiring distance, the partitions adjacent to each other in a direction in which the wiring extends.

2. The semiconductor device according to claim 1, wherein the insulating material is any one of SiOx, SiOxNy, and an insulating organic resin.

3. The semiconductor device according to claim 1, wherein the interval between the partitions arranged between the two pieces of wiring, the partitions adjacent to each other in the direction in which the wiring extends is made larger as the inter-wiring distance regarding the two pieces of wiring wired in the redistribution layer is shorter.

4. The semiconductor device according to claim 1, wherein the partition has a rectangular parallelepiped shape.

5. The semiconductor device according to claim 1, wherein the void is a hole formed in an insulating material that enters between the pieces of wiring.

6. The semiconductor device according to claim 1, wherein photoelectric conversion elements that perform photoelectric conversion are formed in a two-dimensional array in the semiconductor substrate.

7. A semiconductor device, comprising:

a semiconductor substrate;

a wiring layer including an electrode pad, the wiring layer formed on a first surface of the semiconductor substrate;

a redistribution layer including wiring electrically connected to the electrode pad via a via, the redistribution layer formed on a second surface side opposite to the first surface of the semiconductor substrate;

a protective film formed on a surface on a side opposite to the semiconductor substrate in the redistribution layer; and a partition formed by an insulating material, the partition arranged between pieces of wiring in the redistribution layer, wherein the partition and a void are alternately formed between the pieces of wiring in a direction in which the wiring extends, and wherein the partition has a cylindrical shape an axial direction of which coincides with a stacking direction of the redistribution layer with respect to the semiconductor substrate.

8. The semiconductor device according to claim 7, wherein the insulating material is any one of SiOx, SiOxNy, and an insulating organic resin.

9. The semiconductor device according to claim 7, wherein two pieces of wiring having a first inter-wiring distance and two pieces of wiring having a second inter-wiring distance are formed in the redistribution layer, wherein the first inter-wiring distance is made shorter than the second inter-wiring distance, and wherein an interval between partitions arranged between the two pieces of wiring having the first inter-wiring distance, the partitions adjacent to each other in a direction in which the wiring extends is made larger than an interval between the partitions arranged between the two pieces of wiring having the second inter-wiring distance, the partitions adjacent to each other in a direction in which the wiring extends.

10. The semiconductor device according to claim 9, wherein the interval between the partitions arranged between the two pieces of wiring, the partitions adjacent to each other in the direction in which the wiring extends is made larger as the inter-wiring distance regarding the two pieces of wiring wired in the redistribution layer is shorter.

11. The semiconductor device according to claim 7, wherein the void is a hole formed in an insulating material that enters between the pieces of wiring.

12. The semiconductor device according to claim 7, wherein an insulating resin film is formed between the semiconductor substrate and the redistribution layer, and the void is formed as a space reaching an inside of the insulating resin film.

13. The semiconductor device according to claim 7, wherein photoelectric conversion elements that perform photoelectric conversion are formed in a two-dimensional array in the semiconductor substrate.

14. A semiconductor device, comprising:

a semiconductor substrate;

a wiring layer including an electrode pad, the wiring layer formed on a first surface of the semiconductor substrate;

a redistribution layer including wiring electrically connected to the electrode pad via a via, the redistribution layer formed on a second surface side opposite to the first surface of the semiconductor substrate;

a protective film formed on a surface on a side opposite to the semiconductor substrate in the redistribution layer; and a partition formed by an insulating material, the partition arranged between pieces of wiring in the redistribution layer, wherein the partition and a void are alternately formed between the pieces of wiring in a direction in which the wiring extends, wherein an insulating resin film is formed between the semiconductor substrate and the redistribution layer, and wherein the void is formed as a space reaching an inside of the insulating resin film.

15. The semiconductor device according to claim 14, wherein the insulating material is any one of SiOx, SiOxNy, and an insulating organic resin.

16. The semiconductor device according to claim 14, wherein two pieces of wiring having a first inter-wiring distance and two pieces of wiring having a second inter-wiring distance are formed in the redistribution layer, wherein the first inter-wiring distance is made shorter than the second inter-wiring distance, and wherein an interval between partitions arranged between the two pieces of wiring having the first inter-wiring distance, the partitions adjacent to each other in a direction in which the wiring extends is made larger than an interval between the partitions arranged between the two pieces of wiring having the second inter-wiring distance, the partitions adjacent to each other in a direction in which the wiring extends.

17. The semiconductor device according to claim 16, wherein the interval between the partitions arranged between the two pieces of wiring, the partitions adjacent to each other in the direction in which the wiring extends is made larger as the inter-wiring distance regarding the two pieces of wiring wired in the redistribution layer is shorter.

18. The semiconductor device according to claim 14, wherein the partition has a cylindrical shape an axial direction of which coincides with a stacking direction of the redistribution layer with respect to the semiconductor substrate.

19. The semiconductor device according to claim 14, wherein the partition has a rectangular parallelepiped shape.

20. The semiconductor device according to claim 14, wherein the void is a hole formed in an insulating material that enters between the pieces of wiring.

* * * * *